(12) United States Patent
Fujioka

(10) Patent No.: US 6,341,100 B1
(45) Date of Patent: Jan. 22, 2002

(54) SEMICONDUCTOR INTEGRATED CIRCUIT HAVING CIRCUIT FOR WRITING DATA TO MEMORY CELL

(75) Inventor: Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/575,363

(22) Filed: May 22, 2000

(30) Foreign Application Priority Data

Jul. 22, 1999 (JP) .......................................... 11-208212

(51) Int. Cl.[7] .............................................. G11C 8/00
(52) U.S. Cl. .................................. 365/233; 365/230.03
(58) Field of Search ........................... 365/233, 230.03, 365/230.01

(56) References Cited

U.S. PATENT DOCUMENTS 5,268,865 A * 12/1993 Takasugi ................ 365/189.05
5,896,347 A * 4/1999 Tomita et al. ................ 365/233

* cited by examiner

Primary Examiner—David Nelms
Assistant Examiner—Hoai V. Ho
(74) Attorney, Agent, or Firm—Arent Fox Kintner Plotkin & Kahn, PLLC

(57) ABSTRACT

A controlling signal generating unit generates a bit line controlling signal, a word line signal, a sense amplifier activating signal, and a column line signal. The bit line controlling signal activates a resetting circuit which resets a bit line. The word line signal controls the connection between a memory cell and the bit line which transmits data to the memory cell. The sense amplifier activating signal activates a sense amplifier which amplifies data transmitted to the bit line. The column line signal activates a column switch which transmits data to the bit line. The controlling signal generating unit activates predetermined signal(s) among the word line signal, the sense amplifier activating signal, the bit line controlling signal, and the column line signal at the start of a write operation. The controlling signal generating unit activates the remaining signal(s) after the acceptance of write data. Since the predetermined signal(s) is/are activated without the acceptance of write data, it is possible to make the activating timing of the remaining signal(s) earlier. This consequently reduces the time necessary for a write operation.

15 Claims, 24 Drawing Sheets

SEMICONDUCTOR INTEGRATED CIRCUIT HAVING CIRCUIT FOR WRITING DATA TO MEMORY CELL

BACKGROUND OF THE INVENTION

1. Field of the Invention

The present invention relates to a semiconductor integrated circuit which accepts serial data in synchronization with a clock signal and writes the data in a memory cell as parallel data. In particular, the present invention relates to a technique for performing a write operation at higher speed.

2. Description of the Related Art

These kinds of semiconductor integrated circuits having been developed include FCRAMs (Fast Cycle RAMs). FCRAMs are divided into two types. One type has an SDRAM like (Synchronous DRAM) interface for accepting data in synchronization with the rises of a single-phase clock signal. The other has a DDR SDRAM like (Double Data Rate SDRAM) interface for accepting serial data in synchronization with the respective rises of complementary clock signals (or in synchronization with both the rises and falls of a single-phase clock signal). The general outlines of FCRAMs are described in NIKKEI ELECTRONICS 1998.6.15 (no. 718), Nikkei business publications.

FIG. 1 shows the main parts associated with a write operation in the FCRAM with an SDRAM like interface. The FCRAM has an input controlling unit 1, a core timing controlling unit 2, a core controlling signal generating unit 3, and a memory core unit 4 as the circuit associated with the write operation.

The input controlling unit 1 has a clock buffer 5, an input buffer 6, a command decoder 7, an RASZ generator 8, a serial/parallel controlling circuit 9, a DQ buffer 10, and a serial/parallel conversion circuit 11.

The clock buffer 5 receives a clock signal CLK from the exterior, and outputs an internal clock signal ICLKZ. The input buffer 6 accepts a command signal CMD in synchronization with the internal clock signal ICLKZ, and outputs the accepted signal as an internal command signal ICMD. The command decoder 7 receives the internal command signal ICMD, decodes the command, and outputs a command activating signal ACTZ. The RASZ generator 8 receives the command activating signal ACTZ and a self-precharging signal SPRZ, and outputs a basic signal BRASZ for controlling circuit associated with row addressing. The serial/parallel controlling circuit 9 receives the internal clock signal ICLKZ, and outputs a write switching signal WSWZ. The DQ buffer 10 sequentially receives serial data signals DQ in synchronization with the internal clock signal ICLKZ and outputs the received signals as internal data signals DI0 and DI1. The serial/parallel conversion circuit 11 accepts the internal data signals DI0 and DI1 in synchronization with the write switching signal WSWZ and respectively outputs the accepted signals as common data signals CDB0Z and CDB1Z.

The core timing controlling unit 2 has a BLT activating timing generator 12, a word line activating timing generator 13, an SA activating timing generator 14, and a CL activating timing generator 15.

The BLT activating timing generator 12 receives the basic signal BRASZ, the write switching signal WSWZ, and a word line inactivating signal WLRZ, and outputs a bit line activating signal BLSZ and a bit line inactivating signal BLRZ. The word line activating timing generator 13 receives the bit line activating signal BLSZ and the basic signal BRASZ, and outputs a word line activating signal WLSZ and the word line inactivating signal WLRZ. The SA activating timing generator 14 receives the word line activating signal WLSZ and the word line inactivating signal WLRZ, and outputs a sense amplifier activating timing signal BLEZ. The CL activating timing generator 15 receives the sense amplifier activating timing signal BLEZ, and outputs a column line activating signal BCLZ and the self-precharging signal SPRZ.

The core controlling signal generating unit 3 has a BLT generator 16, a main-word decoder 17, a sense amplifier controller 18, and a column decoder 19.

The BLT generator 16 receives the bit line activating signal BLSZ and the bit line inactivating signal BLRZ, and outputs bit line controlling signals BLTX, BLTZ and a bit line controlling signal BRSX for precharging bit lines BL, /BL. The main-word decoder 17 receives the word line activating signal WLSZ and the word line inactivating signal WLRZ, and output a word line signal WLZ. The sense amplifier controller 18 receives the sense amplifier activating timing signal BLEZ, and outputs sense amplifier activating signals LEX and LEZ. The column decoder 19 receives the column line activating signal BCLZ, and outputs a column line signal CLZ.

The memory core unit 4 includes sense amplifiers 20, memory cells 21, and other components. The memory core unit 4 receives the bit line controlling signals BLTX, BLTZ, and BRSX, the word line signal WLZ, the sense amplifier activating signals LEX and LEZ, the column line signal CLZ, and the common data signals CDB0Z and CDB1Z.

Of the signals described above, those with trailing "z" are positive logic signals, and those with trailing "X" are negative logic signals. Incidentally, address signals are omitted from FIG. 1. In actual device, the above-described circuits are activated in accordance with address signals, thereby selecting a predetermined memory cell.

FIG. 2 shows the main parts of the memory core unit 4.

The memory core unit 4 has plural pairs of complementary bit lines BL and /BL. The bit lines BL are connected with one another through nMOSs 4a and 4b. The bit lines /BL are connected with one another through nMOSs 4c and 4d. The bit lines BL and /BL are connected to nMOSs 4e and 4f for equalizing, nMOSs 4g and 4h for precharging, column switches 4i and 4j each consisting of an nMOS, a sense amplifier 20, and a memory cell 21.

The gates of the nMOSs 4a and 4c receive the bit line controlling signal BLTX. The gates of the nMOSs 4b and 4d receive the bit line controlling signal BLTZ. The gate of the nMOS 4e receives the bit line controlling signal BLTZ, and the gate of the nMOS 4f receives the bit line controlling signal BLTX.

Either the sources or the drains of the nMOSs 4g and 4h are connected to the bit lines BL and /BL, respectively. The others are connected to a precharging line VPR. The gates of the nMOSs 4g and 4h receive the bit line controlling signal BRSX.

Either the sources or the drains of the column switches 4i and 4j are connected to the bit lines BL and /BL, and the others are connected to data signals LDBX and LDBZ, respectively. The gates of the column switches 4i and 4j receive the column line signal CLZ. The data signals LDBX and LDBZ are complementary signals. The data signal LDBZ and the data signal LDBX carry the same logic as and the inverted logic from that of the common data signal CDB0Z, respectively. Other data signals LDBZ and LDBX (not shown) have the same logic as and the inverted logic from that of the common data signal CDB1Z, respectively.

The sense amplifier 20 has a CMOS inverter consisting of a PMOS 20a and an nMOS 20b, a CMOS inverter consisting of a pMOS 20c and an nMOS 20d, and a PMOS 20e and an nMOS 20f connected to the respective sources of the CMOS inverters to provide power supply thereto. The inputs and outputs of the CMOS inverters are connected to each other, and the respective outputs are connected to the bit lines /BL and BL. Either the source or the drain of the pMOS 20e is connected to the sources of the pMOS 20a and the pMOS 20c, and the other is connected to a power supply line VII. The gate of the pMOS 20e receives the sense amplifier activating signal LEX. Either the source or the drain of the NMOS 20f is connected to the sources of the nMOS 20b and the NMOS 20d, and the other is connected to a ground line VSS. The gate of the nMOS 20f receives the sense amplifier activating signal LEZ.

The memory cell 21 consists of an nMOS 21a for data transfer and a capacitor 21b. The gate of the nMOS 21a receives the word line signal WLZ.

Next, the operation of the above-described FCRAM will be explained.

FIG. 3 shows the timing of consecutive performance of write operations. In this example, two-bit serial data are being written consecutively.

In starting the write operation, a write command WR is supplied from the exterior. The input buffer 6 shown in FIG. 1 accepts the command signal CMD (the write command WR) in synchronization with the rise of the internal clock signal ICLKZ. The command decoder 7 receives the internal command signal ICMD, and activates the command activating signal ACTZ (FIG. 3(a)). The RASZ generator 8 receives the command activating signal ACTZ, and activates the basic signal BRASZ (FIG. 3(b)). The DQ buffer 10 sequentially accepts the data signals DQ in synchronization with the rises of the internal clock signal ICLKZ, and outputs the same in the form of the internal data signals DI0 and DI1 (FIG. 3(c)).

The serial/parallel controlling circuit 9 detects the rising edge of the internal clock signal ICLKZ after the reception of the write command WR, and activates the write switching signal WSWZ (FIG. 3(d)). The serial/parallel conversion circuit 11 accepts the internal data signals DI0 and DI1 in synchronization with the write switching signal WSWZ, executes serial/parallel conversion to the signals accepted, and output the converted data as the common data signals CDB0Z and CDB1Z (FIG. 3(e)).

The BLT activating timing generator 12 receives the activation of the write switching signal WSWZ, and activates the bit line activating signal BLSZ for a predetermined period (FIG. 3(f)). The BLT generator 16 receives the bit line activating signal BLSZ, and activates the bit line controlling signal BLTX and the bit line controlling signal BRSX (FIG. 3(g)). The equalization of the bit lines BL and /BL on the side closer to the memory cell 21 shown in FIG. 2 is terminated by the activation of the bit line controlling signal BLTX and the activation of the bit line controlling signal BLTZ, whereby the bit lines BL and /BL are connected to the sense amplifier 20. The bit lines BL and /BL on the side opposite from the memory cell 21 are equalized, and released from the connection with the sense amplifier 20. The activation of the bit line controlling signal BRSX resets the precharging operation to the bit lines BL and /BL.

The word line activating timing generator 13 shown in FIG. 1 receives the bit line activating signal BLSZ, and activates the word line activating signal WLSZ for a pre-determined period (FIG. 3(h)). The main-word decoder 17 receives the word line activating signal WLSZ, and activates the word line signal WLZ (FIG. 3(i)). Due to the activation of the word line signal WLZ, the data retained in the memory cell 21 are output to the bit lines BL and /BL in the form of a weak signal (FIG. 3(j)).

The SA activating timing generator 14 receives the word activating signal WLSZ, and activates the sense amplifier activating timing signal BLEZ (FIG. 3(k)). The sense amplifier controller 18 receives the sense amplifier activating timing signal BLEZ, and activates the sense amplifier activating signals LEX and LEZ (FIG. 3(l)). In response to the sense amplifier activating signals LEX and LEZ, the sense amplifier 20 is activated to amplify the weak signal output to the bit lines BL and /BL.

The CL activating timing generator 15 receives the sense amplifier activating timing signal BLEZ, and activates the column line activating signal BCLZ for a predetermined period (FIG. 3(m)). The column decoder 19 receives the column line activating signal BCLZ, and activates the column line signal CLZ for a predetermined period (FIG. 3(n)). Due to the activation of the column line signal CLZ, the common data signal CDB0Z is supplied through the complementary data signals LDBX and LDBZ to the bit lines BL and /BL, and written in the memory cell 21 (FIG. 3(o)). Meanwhile, the common data signal CDB1Z is supplied through the complementary data signals LDBX and LDBZ to other bit lines BL and /BL, and written in another memory cell 21. In other words, the serially-input data signals DQ are written in the memory cells 21 in the form of parallel data. Here, if the weak signal output from a memory cell 21 is inverse in logic from the data signals LDBX, LDBZ, then a signal inverting operation is required.

Incidentally, in synchronization with the seventh clock signal CLK from the reception of the write command WR, a next command signal (write command WR) is accepted. That is, in this example, the number of clocks required for one write operation is seven (latency=7).

The RASZ generator 8 receives the self-precharging signal SPRZ (not shown) output from the CL activating timing generator 15, and inactivates the basic signal BRASZ (FIG. 3(p)). The word line activating timing generator 13 receives the basic signal BRASZ, and activates the word line inactivating signal WLRZ for a predetermined period (FIG. 3(q)). The main-word decoder 17 receives the word line inactivating signal WLRZ, and inactivates the word line signal WLZ (FIG. 3(r)). Due to the inactivation of the word line signal WLZ, the memory cell 21 is closed to retain the written data.

The SA activating timing generator 14 receives the word line inactivating signal WLRZ, and inactivates the sense amplifier activating timing signal BLEZ (FIG. 3(s)). The sense amplifier controller 18 receives the sense amplifier activating timing signal BLEZ, and inactivates the sense amplifier activating signals LEX and LEZ (FIG. 3(t)). Due to the inactivation of the sense amplifier activating signals LEX and LEZ, the sense amplifier 20 terminates its amplifying operation.

The BLT activating timing generator 12 receives the word line inactivating signal WLRZ, and activates the bit line inactivating signal BLRZ for a predetermined period (FIG. 3(u)). The BLT generator 16 receives the bit line inactivating signal BLRZ, activates the bit line controlling signal BLTX, and activates the bit line controlling signal BRSX (FIG. 3(v)). Due to the activates of the bit line controlling signal BLTX, the bit lines BL and /BL shown to the side closer to the memory cell 21 in FIG. 2 are equalized. The bit lines BL and /BL on the side opposite from the memory cell 21 are released from equalization, and connected to the sense amplifier 20. The activation amplifier 20. The [inactivation] activation of the bit line controlling signal BRSX precharges the bit lines BL and /BL.

Then, the above-described operations are repeated to perform write operations consecutively.

FIG. 4 shows the timing of performing the read operation after the write operation. In the write operation, the circuits operate at the same timing as shown in FIG. 3 described above. However, it needs to operate the memory core unit 4 in accordance with the acceptance of the data signals DQ in the write operation. On this account, the memory core unit 4 is operated by activating the bit line activating signal BLSZ, the word line activating signal WLSZ, and the like in synchronization with the activation of the write switching signal WSWZ after accepting the two-bit data signals DQ as internal data signals DI0 and DI1. That is, the memory core unit 4 delays in starting an operation in the write operation, compared to in the read operation. Accordingly, in this example, ten clocks are needed for the memory core unit 4 to prevent its controls for write and read operations from overlapping with each other. The number of clocks (the latency) required for each operation depends on the clock signal frequency.

In the read operation after the write operation, the input buffer 6 shown in FIG. 1 accepts a read command RD at the rise of the internal clock signal ICLKZ. The command decoder 7 receives the internal command signal ICMD, and activates the command activating signal ACTZ (FIG. 4(a)). The RASZ generator 8 receives the command activating signal ACTZ and activates the basic signal BRASZ (FIG. 4(b)). The BLT activating timing generator 12 receives the basic signal BRASZ, and activates the bit line activating signal BLSZ (FIG. 4(c)).

Subsequently, the same timing as that in a write operation is used to activate/inactivate the bit line controlling signals BLTX and BLTZ, the bit line controlling signal BRSX, the word line signal WLZ, the sense amplifier activating signals LEX and LEZ, and the column line signal CLZ, whereby the read operation is executed.

In read operations, the weak signal output from the memory cell 21 to the bit lines BL and /BL due to the activation of the word line signal WLZ is just amplified as read data. Therefore, the data are not inverted during read operations.

The signal amplified is transferred as the common data signal CDB0Z (FIG. 4(d)). The transferred signal is output as the data signal DQ in synchronization with the seventh clock signal CLK from the acceptance of the read command RD (FIG. 4(e)). Similarly, the signal amplified on the other bit lines BL and /BL is transferred as the common data signal CDB1Z, and output as the data signal DQ in synchronization with the eighth clock signal CLK from the acceptance of the read command RD.

As discussed above, the write operation being executed before a read operation requires ten clocks, three clocks more than usual.

For example, when a system equipped with FCRAMs repeats a write operation and a read operation alternately, a problem arises in that the entire system takes more processing time.

In addition, the memory core unit 4 supplies the same controlling timing to both write and read operations. Therefore, in a write operation, the weak signal output from the memory cell 21 is amplified by the sense amplifier 20 before write data are supplied to the bit lines BL and /BL. This requires a data inverting operation, thereby causing a problem of lengthening write time.

Meanwhile, for the sake of reducing the amplifying time, a sense amplifier 200 shown in FIG. 5 has been proposed as a substitute for the sense amplifier 20.

In this sense amplifier 200, the sources of pMOSs 200a and 200b in the respective CMOS inverters are connected with a pMOS 200c for establishing connection to a power supply line VII and a pMOS 200d for establishing connection to a power supply line VDD. The power supply line VDD is higher in voltage than the power supply line VII. The gate of the pMOS 200d receives a sense amplifier activating signal LEPX. The sense amplifier activating signals LEX, LEZ, and LEPX are generated by a sense amplifier controller (not shown). The other circuit configuration is the same as that of the sense amplifier 20 described above.

FIG. 6 shows the read amplifying operation of this sense amplifier 200.

Initially, the word line signal WLZ is activated, whereby a weak signal, which is the read data from the memory cell, is output to the bit lines BL and /BL. Then, the sense amplifier controller (not shown) activates the sense amplifier activating signals LEZ and LEPX. Due to the activation of the sense amplifier activating signals LEZ and LEPX, the slight voltage difference between the bit lines BL and /BL is amplified with its lower voltage toward the ground voltage VSS and its higher voltage toward the power supply voltage VDD (an overdrive period). Then, the sense amplifier controller inactivates the sense amplifier activating signal LEPX, and activates the sense amplifier activating signal LEX. By turning on the pMOS 200c shown in FIG. 5, the higher voltage is lowered to the power supply voltage VII. Since the higher voltage is boosted toward the power supply voltage VDD, the amplifying speed in the read operation is higher as compared to that of ordinary sense amplifiers (the chain line in the diagram).

FIG. 7 shows the write amplifying operation of the sense amplifier 200.

Initially, the word line signal WLZ is activated, whereby a weak signal irrelevant to the write data is output from the memory cell. Then, the sense amplifier controller (not shown) activates the sense amplifier activating signals LEZ and LEPX. Due to the activation of the sense amplifier activating signals LEZ and LEPX, the weak signal across the bit lines BL and /BL is amplified with its low-level side toward the ground voltage VSS and its high-level side toward the power supply voltage VDD. Subsequently, due to the activation of the column line signal CLZ, the write data is supplied to the bit lines BL and /BL and the weak signal amplified is inverted. Since the amplification level of the weak signal becomes greater than the amplification level in ordinary sense amplifiers (the chain line in the diagram), the time needed for data inversion becomes longer. This causes a problem of lengthening write time.

SUMMARY OF THE INVENTION

An object of the present invention is to provide a semiconductor integrated circuit which can reduce the time necessary for writing data in a memory cell.

According to one of the aspects of the semiconductor integrated circuit in the present invention, a controlling signal generating unit generates a bit line controlling signal, a word line signal, a sense amplifier activating signal, and a column line signal.

The bit line controlling signal activates a resetting circuit which resets a bit line. The word line signal controls the connection between a memory cell and the bit line which transmits data to the memory cell. The sense amplifier activating signal activates a sense amplifier which amplifies data transmitted to the bit line. The column line signal activates a column switch which transmits data to the bit line.

The controlling signal generating unit activates predetermined signal(s) among the word line signal, the sense amplifier activating signal, the bit line controlling signal, and the column line signal at the start of a write operation. The controlling signal generating unit activates the remaining signal(s) after receiving write data.

Since the predetermined signal(s) is/are activated without receiving write data, it is possible to make the activating timing of the remaining signal(s) earlier. This consequently reduces the time necessary for a write operation.

According to another aspect of the semiconductor integrated circuit in the present invention, a serial/parallel conversion circuit accepts serial data to be written in the memory cell and converts it into parallel data. The controlling signal generating unit activates the aforesaid remaining signal(s) in synchronization with an accepting signal used for the serial/parallel conversion circuit. This reliably activates the remaining signal(s) without generating a new controlling signal.

According to yet another aspect of the semiconductor integrated circuit in the present invention, the first controlling circuit in the controlling signal generating unit activates the first activating signal in synchronization with an accepting signal in a write operation. The first controlling circuit of the controlling signal generating unit keeps activating the first activating signal throughout a read operation. The second controlling circuit in the controlling signal generating unit generates the second activating signal in synchronization with the start of a write operation and the start of a read operation. A detecting circuit detects the activation of both the first and the second activating signals. Then, the controlling signal generating unit generates the aforesaid remaining signal(s) by using the detection result of the detecting circuit.

This allows easy generation of the remaining signal(s) at respective predetermined timings in write and read operations.

According to another aspect of the semiconductor integrated circuit in the present invention, the first controlling circuit in the controlling signal generating unit activates the first activating signal in synchronization with the accepting signal in a write operation. In a read operation, the second controlling circuit in the controlling signal generating unit activates the second activating signal in synchronization with the start of the read operation. The detecting circuit detects the activation either the first or the second activating signal. Then, the controlling signal generating unit generates the aforesaid remaining signal(s) by using the detection result from the detecting circuit.

This allows easy generation of the remaining signal(s) at respective predetermined timings in write and read operations.

According to another aspect of the semiconductor integrated circuit in the present invention, the column switch is activated earlier in a write operation than it would in a read operation. This makes it possible to supply write data to the bit line before or immediately after the amplification of a weak signal output from a memory cell. When a logic level of the weak signal differs from that of the write data, the data need to be inverted. However, the amplification of the weak signal is minimized as described above so that the time required for the inverting operation is reduced. This consequently reduces the time necessary for a write operation.

According to another aspect of the semiconductor integrated circuit in the present invention, the sense amplifier has an overdriving function of using a higher voltage for a predetermined period at the start of amplification. In a write operation, the activation of the column switch is started before the initiation of the overdriving. On this account, write data are supplied to the bit line before the amplification of a weak signal by the overdriving. This minimizes the amplification of the weak signal irrelevant to the write data by the overdriving. As a result, it is possible to have the overdriving well functioning in a read operation while precluding the overdriving in a write operation. This consequently reduces the time necessary for a write operation without increasing the time required for a read operation.

According to another aspect of the semiconductor integrated circuit in the present invention, the predetermined signal(s) can be activated without the acceptance of write data, resulting in making the activating timing of the remaining signal(s) earlier. This consequently reduces the time necessary for a write operation.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
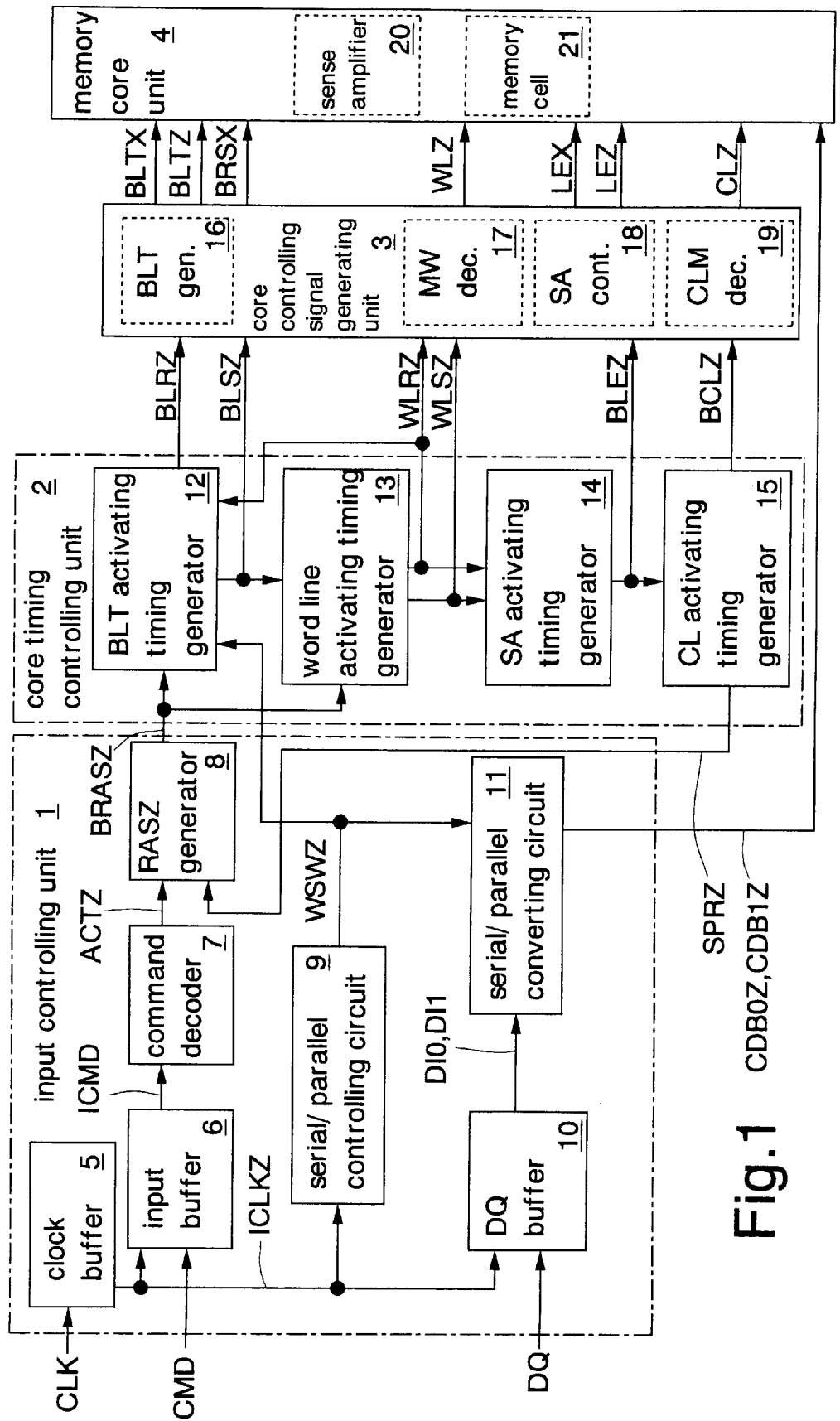
FIG. 1 is a block diagram showing the circuit associated with the write operation in the conventional FCRAM.

Hereinafter, preferred embodiments of the present invention will be described with reference to the accompanying drawings. Incidentally, like circuits to those discussed in the prior art will be designated by like reference numerals, and detailed description of these circuits will be omitted here. In addition, like signals to those discussed in the prior art are designated by like reference symbols.

Figure 8:
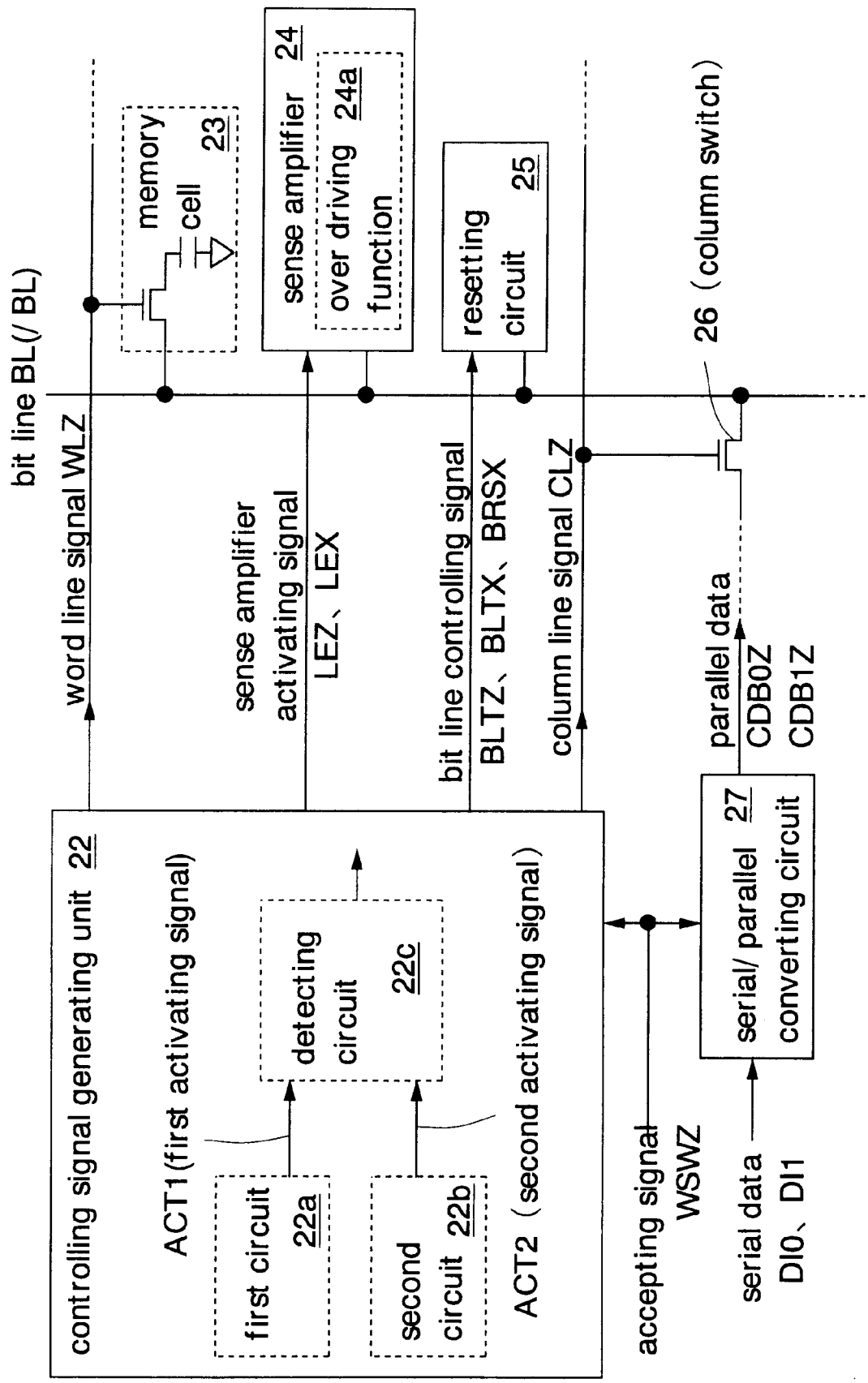
FIG. 8 is a block diagram showing the basic principle of the inventions.

FIG. 8 is a block diagram showing the basic principle of the present invention.

A controlling signal generating unit 22 generates bit line controlling signals BLTZ, BLTX, and BRSX, a word line signal WLZ, sense amplifier activating signals LEZ and LEX, and a column line signal CLZ.

The bit line controlling signals BLTZ, BLTX, and BRSX activate a resetting circuit 25 for resetting bit lines BL and /BL. The word line signal WLZ controls connection between a memory cell 23 and the bit lines BL, /BL for transmitting data to the memory cell 23. The sense amplifier activating signals LEZ and LEX activate a sense amplifier 24 for amplifying data transmitted to the bit lines BL and /BL. The column line signal CLZ activates a column switch 26 for transmitting data to the bit lines BL and /BL.

The controlling signal generating unit 22 activates a predetermined signal(s) among the word line signal WLZ, the sense amplifier activating signals LEZ and LEX, the bit line controlling signals BLTZ, BLTX, and BRSX, and the column line signal CLZ at the start of a write operation. The controlling signal generating unit 22 activates the remaining signal(s) after the acceptance of write data DI0 and DI1.

A serial/parallel conversion circuit 27 accepts in the form of serial data the write data DI0 and DI1 to be written in the memory cell 23, and converts the same into parallel data CDB0Z and CDB1Z. The controlling signal generating unit 22 activates the remaining signal(s) mentioned above in synchronization with an accepting signal WSWZ from the serial/parallel conversion circuit 27.

The first controlling circuit 22a of the controlling signal generating unit 22 activates the first activating signal ACT1 in synchronization with the accepting signal in a write operation. The first controlling circuit 22a of the controlling signal generating unit 22 keeps activating the first activating signal ACT1 throughout a read operation. Moreover, the second controlling circuit 22b of the controlling signal generating unit 22 generates the second activating signal ACT2 in synchronization with the start of a write operation and the start of a read operation. A detecting circuit 22c detects the activation of both the first activating signal ACT1 and the second activating signal ACT2. Then, the controlling signal generating unit 22 generates the remaining signal(s) by using the detection result of the detecting circuit 22c.

The sense amplifier 24 has an overdriving function 24a of using a higher voltage for a predetermined period at the start of amplification. In a write operation, the activation of the column switch 26 is started before the initiation of the overdrive.

Figure 9:
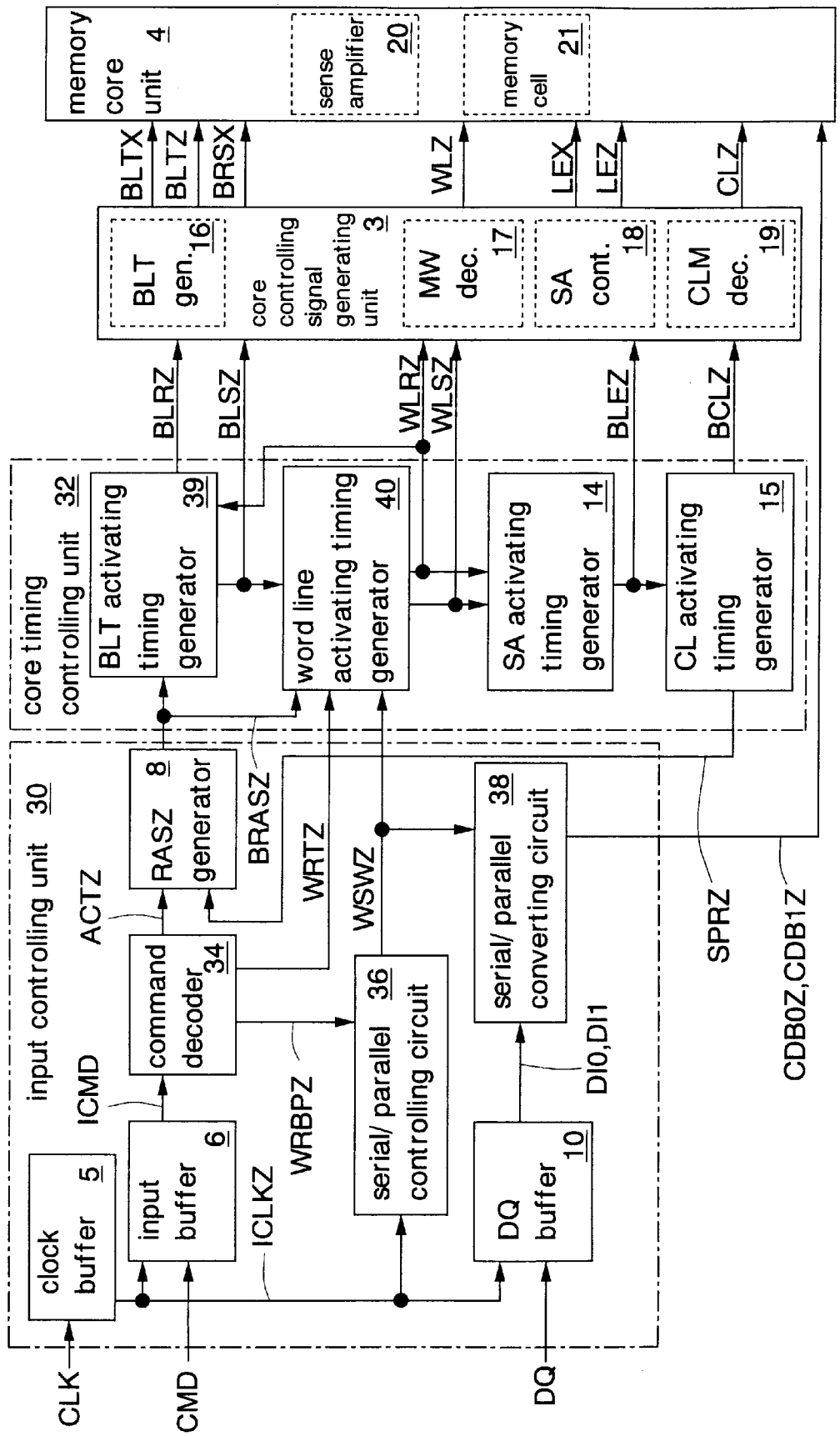
FIG. 9 is a block diagram showing the circuit associated with the write operations in the first embodiment.

FIG. 9 shows the main parts associated with the write operations in a first embodiment of the semiconductor integrated circuit in the present invention.

The semiconductor integrated circuit in this embodiment is formed, for example, as a 64-Mbit FCRAM on a silicon substrate by using a CMOS process technology.

The FCRAM has an input controlling unit 30, a core timing controlling unit 32, a core controlling signal generating unit 3, and a memory core unit 4 as the circuit associated with write operations. The core timing controlling unit 32 and the core controlling signal generating unit 3 correspond to the controlling signal generating unit 22 shown in FIG. 8.

The input controlling unit 30 has a clock buffer 5, an input buffer 6, a command decoder 34, an RASZ generator 8, a serial/parallel controlling circuit 36, a DQ buffer 10, and a serial/parallel conversion circuit 38.

The clock buffer 5 receives a clock signal CLK from the exterior and outputs an internal clock signal ICLKZ. The input buffer 6 accepts a command signal CMD in synchronization with the internal clock signal ICLKZ and outputs the accepted signal as an internal command signal ICMD. The command decoder 34 receives the internal command signal ICMD, decodes the command, and outputs a command activating signal ACTZ and write command signals WRBPZ,WRTZ. The RASZ generator 8 receives the command activating signal ACTZ and a self-precharging signal SPRZ, and outputs a basic signal BRASZ for controlling circuit associated with row addressing. The serial/parallel controlling circuit 36 receives the internal clock signal ICLKZ and the write command signal WRBPZ and outputs a write switching signal WSWZ and other signals. The DQ buffer 10 sequentially receives serial data signals DQ in synchronization with the internal clock signal ICLKZ and outputs the received signals as internal data signals DI0 and DI1. The serial/parallel conversion circuit 38 accepts the internal data signals DI0 and DI1 in synchronization with the write switching signal WSWZ and outputs the accepted signals as parallel common data signals CDB0Z and CDB1Z.

The core timing controlling unit 32 has a BLT activating timing generator 39, a word line activating timing generator 40, an SA activating timing generator 14, and a CL activating timing generator 15.

The BLT activating timing generator 39 receives the basic signal BRASZ and the word line activating signal WLSZ, and outputs a bit line activating signal BLSZ and a bit line inactivating signal BLRZ.

The word line activating timing generator 40 receives the bit line activating signal BLSZ, the basic signal BRASZ, the write command signal WRBPZ, and the write switching signal WSWZ and outputs a word line activating signal WLSZ and a word line inactivating signal WLRZ. The SA activating timing generator 14 receives the word line activating signal WLSZ and the word line inactivating signal WLRZ, and outputs a sense amplifier activating timing signal BLEZ. The CL activating timing generator 15 receives the sense amplifier activating timing signal BLEZ, and outputs a column line activating signal BCLZ and the self-precharging signal SPRZ.

Figure 2:
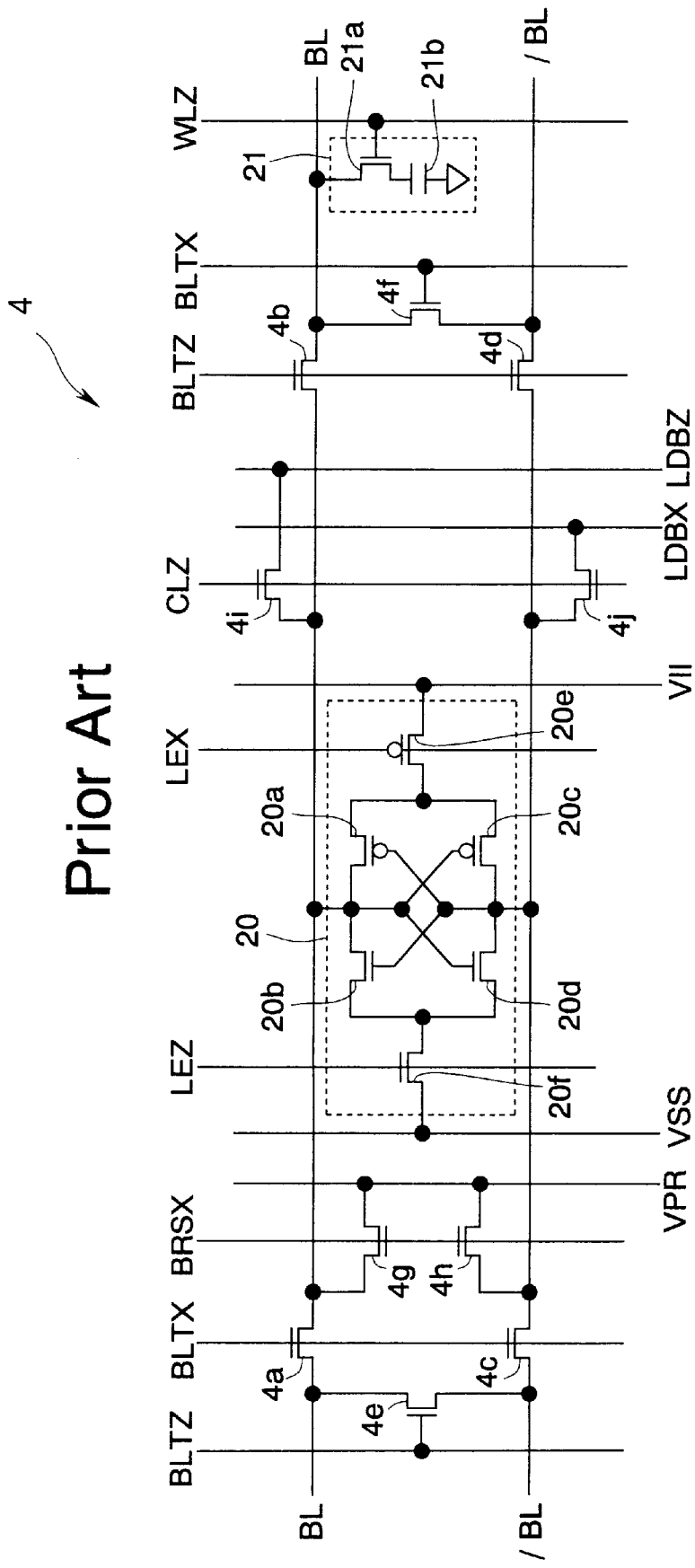
FIG. 2 is a circuit diagram showing the main parts of the memory core unit of FIG. 1.
Figure 3:
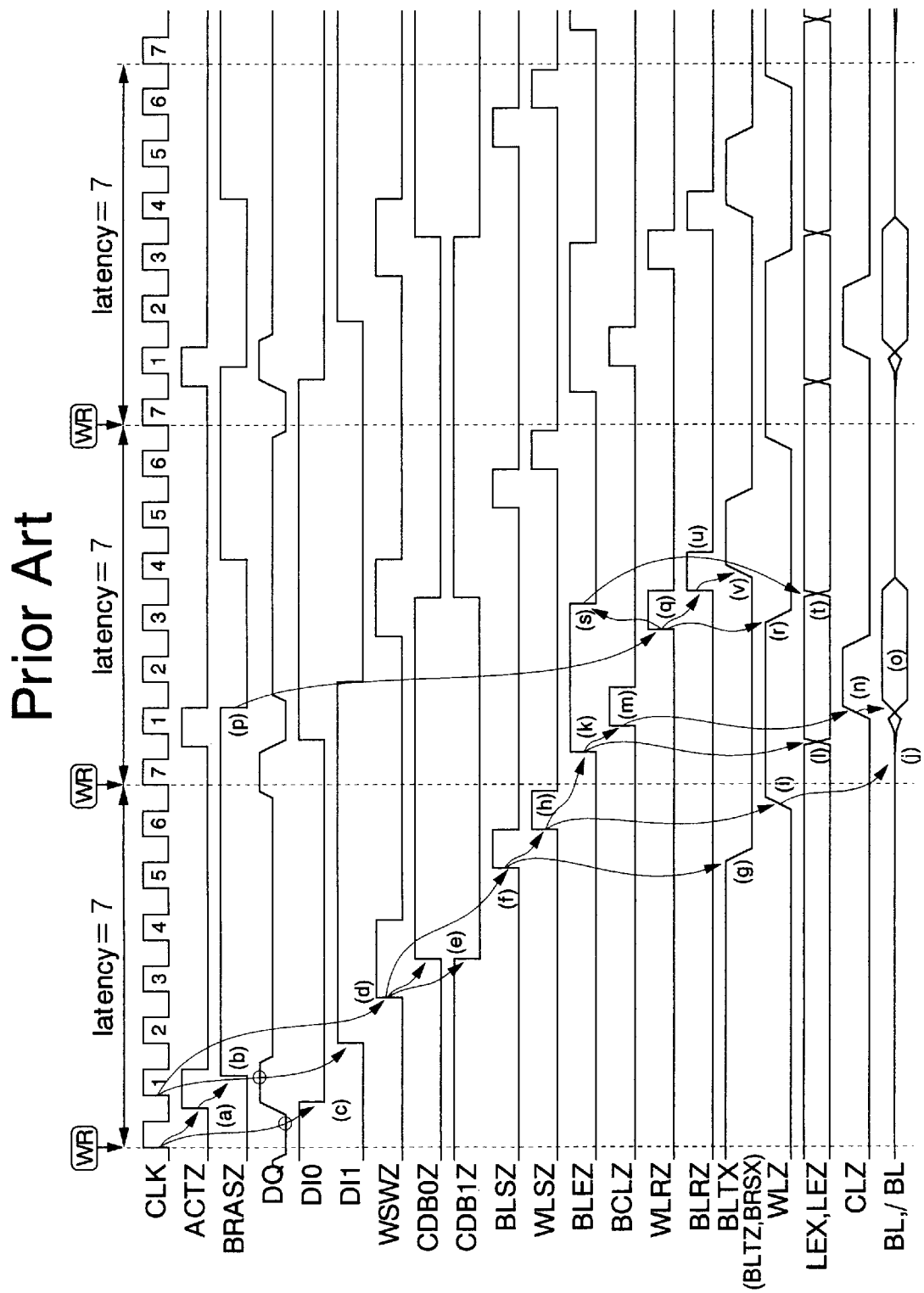
FIG. 3 is a timing chart for consecutive execution of write operations in the conventional FCRAM.
Figure 4:
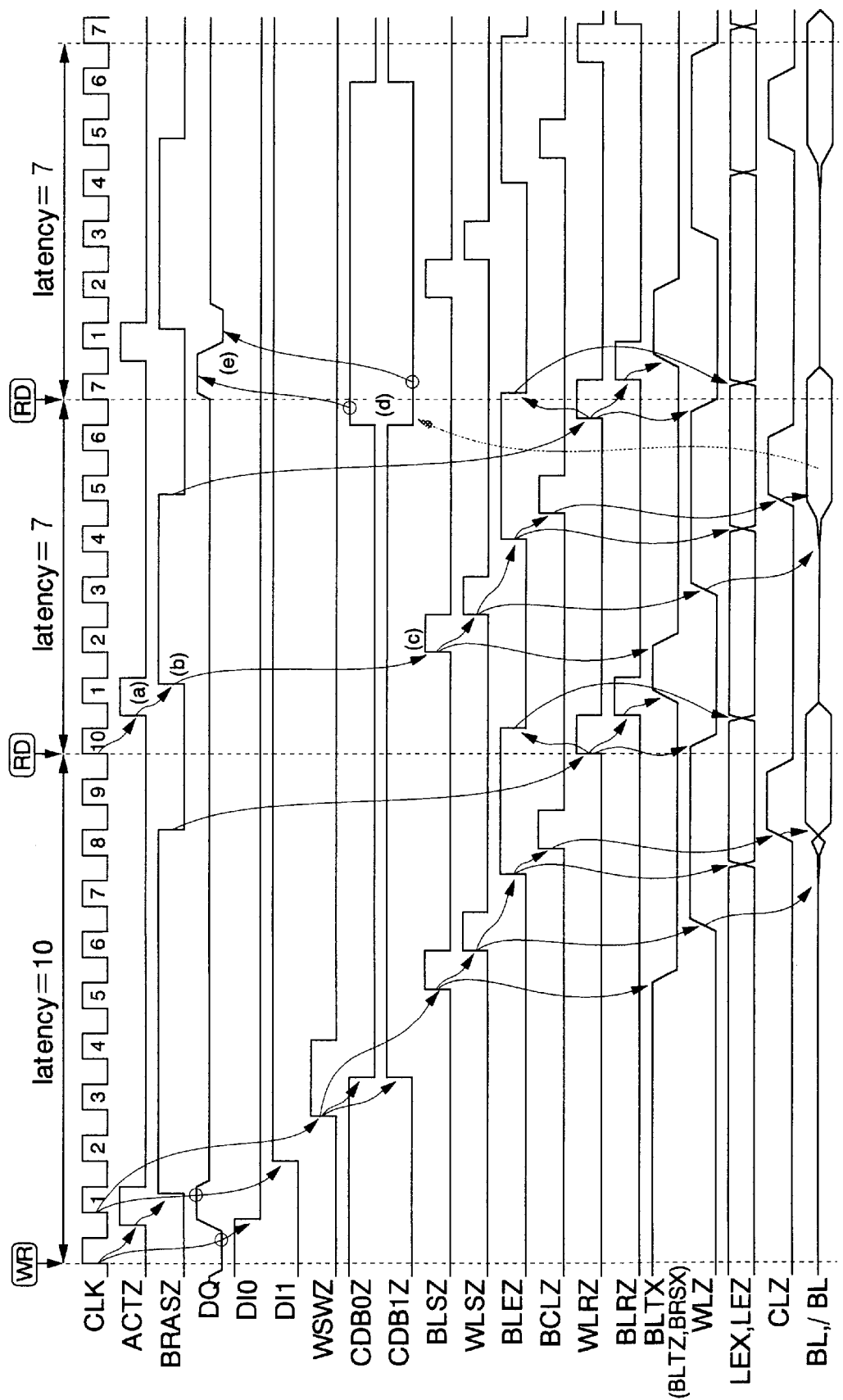
FIG. 4 is a timing chart for execution of a write operation before read operations in the conventional FCRAM.

The circuit configurations and signal connections of the core controlling signal generating unit 3 are the same as those of the prior art, and the main parts of the memory core unit 4 are identical to those of the circuit shown in FIG. 2. That is, the memory core unit 4 receives the bit line controlling signals BLTX, BLTZ, and BRSX for controlling the bit lines BL and /BL, the word line signal WLZ for controlling memory cells 21, the sense amplifier activating signals LEX and LEZ for controlling sense amplifiers 20, and the column line signal CLZ for controlling the column switches 4i and 4j shown in FIG. 2. As shown in FIG. 2, the bit lines BL are connected with one another through the nMOSs 4a and 4b. The bit lines /BL are connected with one another through the nMOSs 4c and 4d. The bit lines BL and /BL are connected to the nMOSs 4e and 4f for equalization, the nMOSs 4g and 4h for precharge, the column switches 4i and 4j each consisting of an nMOS, a sense amplifier 20, and a memory cell 21. The nMOSs 4e, 4f, 4g, and 4h correspond to the resetting circuit.

Incidentally, address signals are omitted from FIG. 9. In actual circuit, the above-mentioned circuits are activated in accordance with address signals, thereby selecting a predetermined memory cell.

Figure 10:
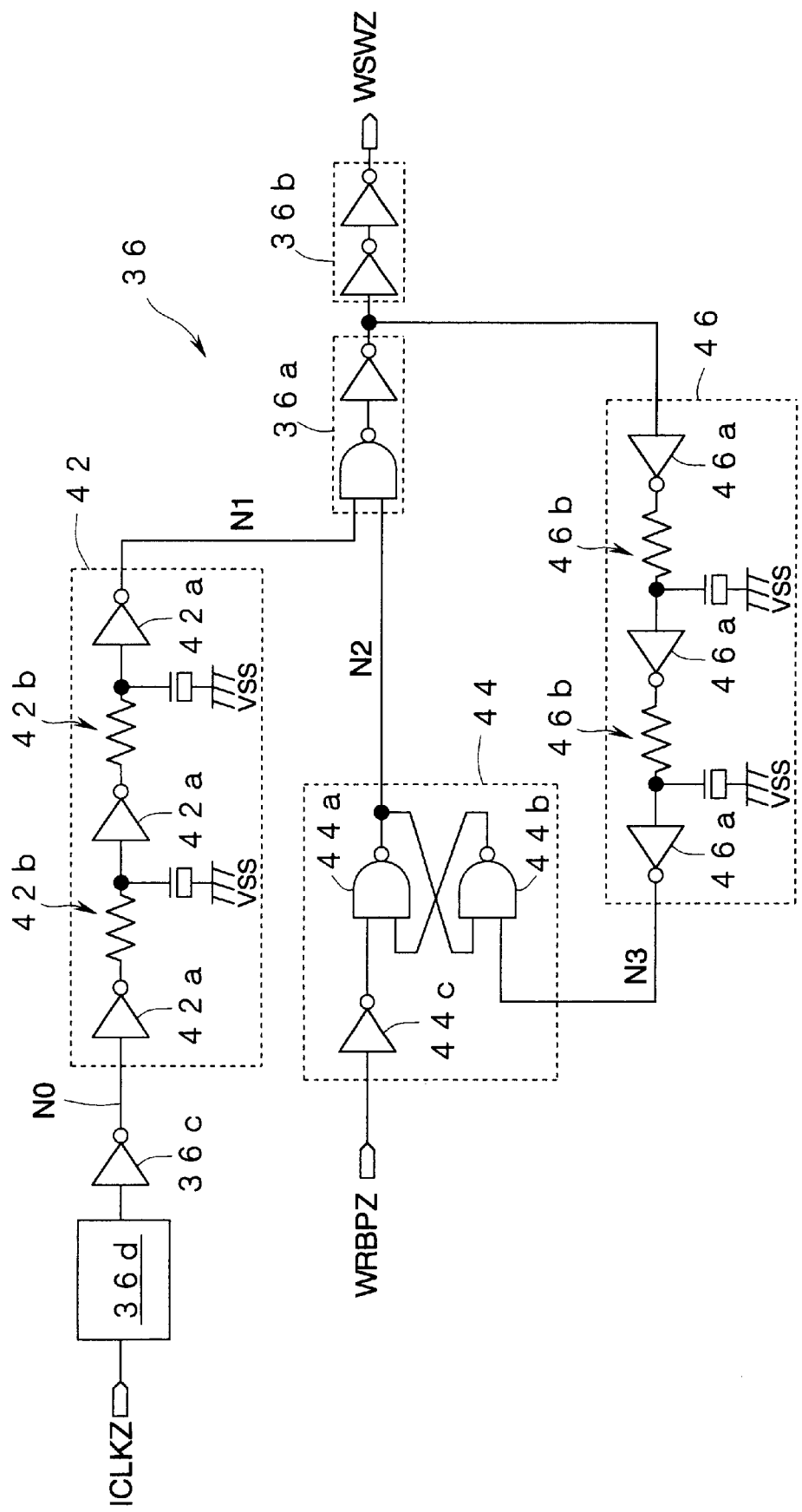
FIG. 10 is a circuit diagram showing the serial/parallel controlling circuit of FIG. 9.

FIG. 10 shows the serial/parallel controlling circuit 36.

The serial/parallel controlling circuit 36 has a delay circuit 42, a flip-flop 44 consisting of two-input NAND gates 44a, 44b and an inverter 44c, a delay circuit 46, a two-input AND gate 36a, a buffer 36b consisting of two inverters, an inverter 36c, and a frequency divider 36d.

The frequency divider 36d receives the internal clock signal ICLKZ, and outputs a signal of one half the frequency to the inverter 36c. The inverter 36c inverts the received signal and outputs the same to a node N0. The delay circuit 42 has two CR time constant circuits 42b interposed among three inverters 42a cascaded with one another. The CR time constant circuits 42b consist of, for example, a diffusion resistance and a MOS capacitance that is an nMOS whose source and drain are connected to the ground line VSS. The delay circuit 42 receives the signal on the node N0, and inverts the signal for output to a node N1. The delay circuit 46 has the same logic as that of the delay circuit 42. The delay circuit 46 receives the output of the AND gate 36a, and delays the signal for output to a node N3.

An input of the NAND gate 44a in the flip-flop 44 receives the write command signal WRBPZ through the inverter 44c. An input of the NAND gate 44b is connected to the node N3. The output of the flip-flop 44 is connected to a node N2.

The inputs of the AND gate 36a are connected to the node N1 and the node N2. The output of the AND gate 36a is output through the buffer 36b as the write switching signal WSWZ.

Figure 11:
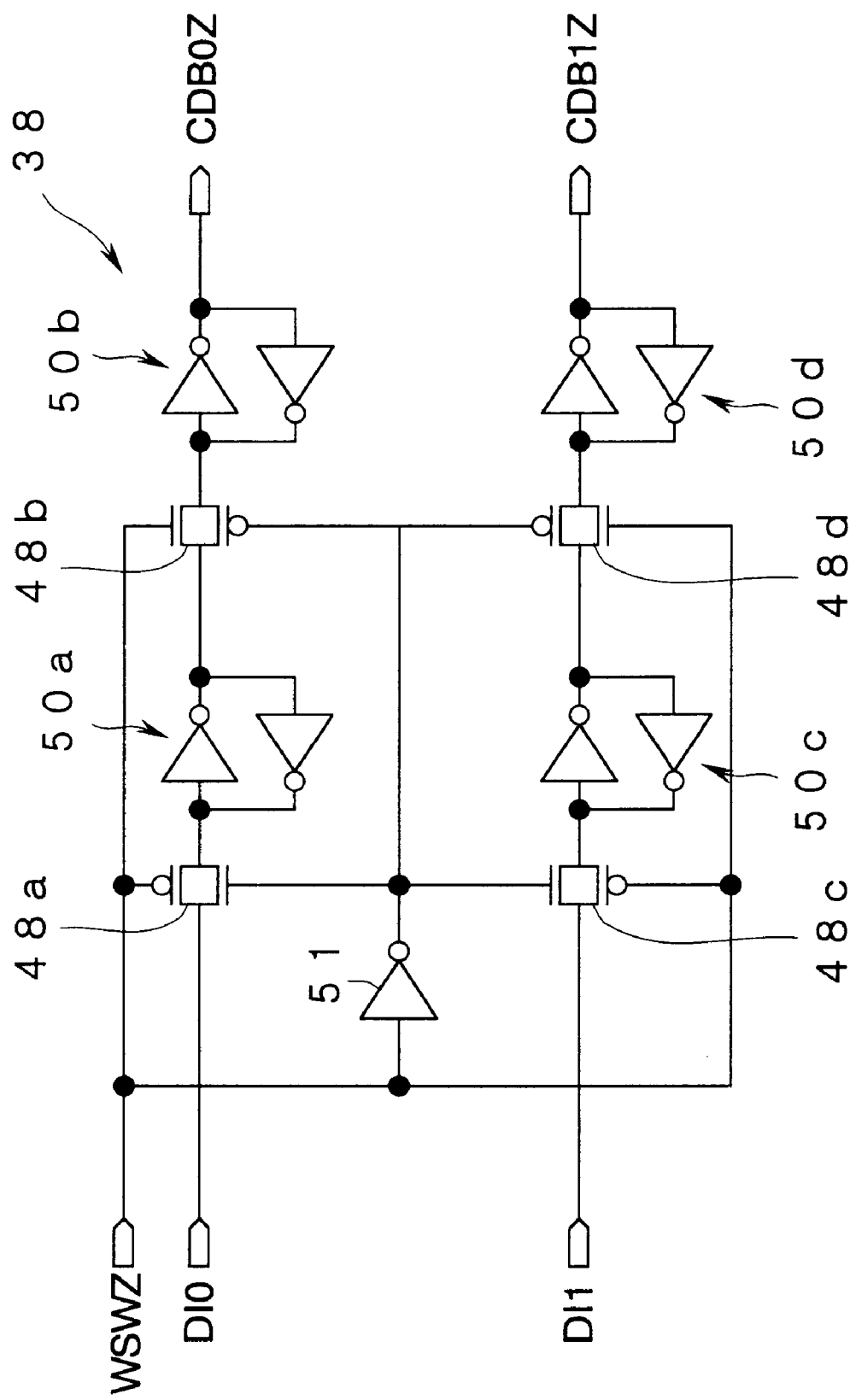
FIG. 11 is a circuit diagram showing the serial/parallel conversion circuit of FIG. 9.

FIG. 11 shows the serial/parallel conversion circuit 38.

The serial/parallel conversion circuit 38 has CMOS transmission gates 48a, 48b, 48c, and 48b, latches 50a, 50b, 50c, and 50d, and an inverter 51. The CMOS transmission gates 48a–48d are formed by connecting the sources and drains of nMOSs and pMOSs with each other. The latches 50a–50d are formed by connecting the inputs and outputs of inverters with each other.

The CMOS transmission gate 48a receives the internal data signal DI0, and outputs this signal to the latch 50a. The latch 50a outputs the inverted logic of the internal data signal DI0 to the CMOS transmission gate 48b. The CMOS transmission gate 48b outputs the received signal to the latch 50b. The latch 50b inverts the received signal for output as the common data signal CDB0Z. The CMOS transmission gate 48c receives the internal data signal DI1, and outputs this signal to the latch 50c. The latch 50c outputs the inverted logic of the internal data signal DI1 to the CMOS transmission gate 48d. The CMOS transmission gate 48d outputs the received signal to the latch 50d. The latch 50d inverts the received signal for output as the common data signal CDB1Z.

The gates of the pMOSs in the CMOS transmission gates 48a, 48c and the gates of the nMOSs in the CMOS transmission gates 48b, 48d receive the write switching signal WSWZ. The gates of the nMOSs in the CMOS transmission gates 48a, 48c and the gates of the pMOSs in the CMOS transmission gates 48b, 48d receive the inverted signal of the write switching signal WSWZ through the inverter 51.

The serial/parallel conversion circuit 38 is a circuit for accepting the internal data signals DI0 and DI1 at a low-level period of the write switching signal WSWZ, latching the accepted data during a high-level period of the write switching signal WSWZ, and outputting the data as the parallel common data signals CDB0Z and CDB1Z.

Figure 12:
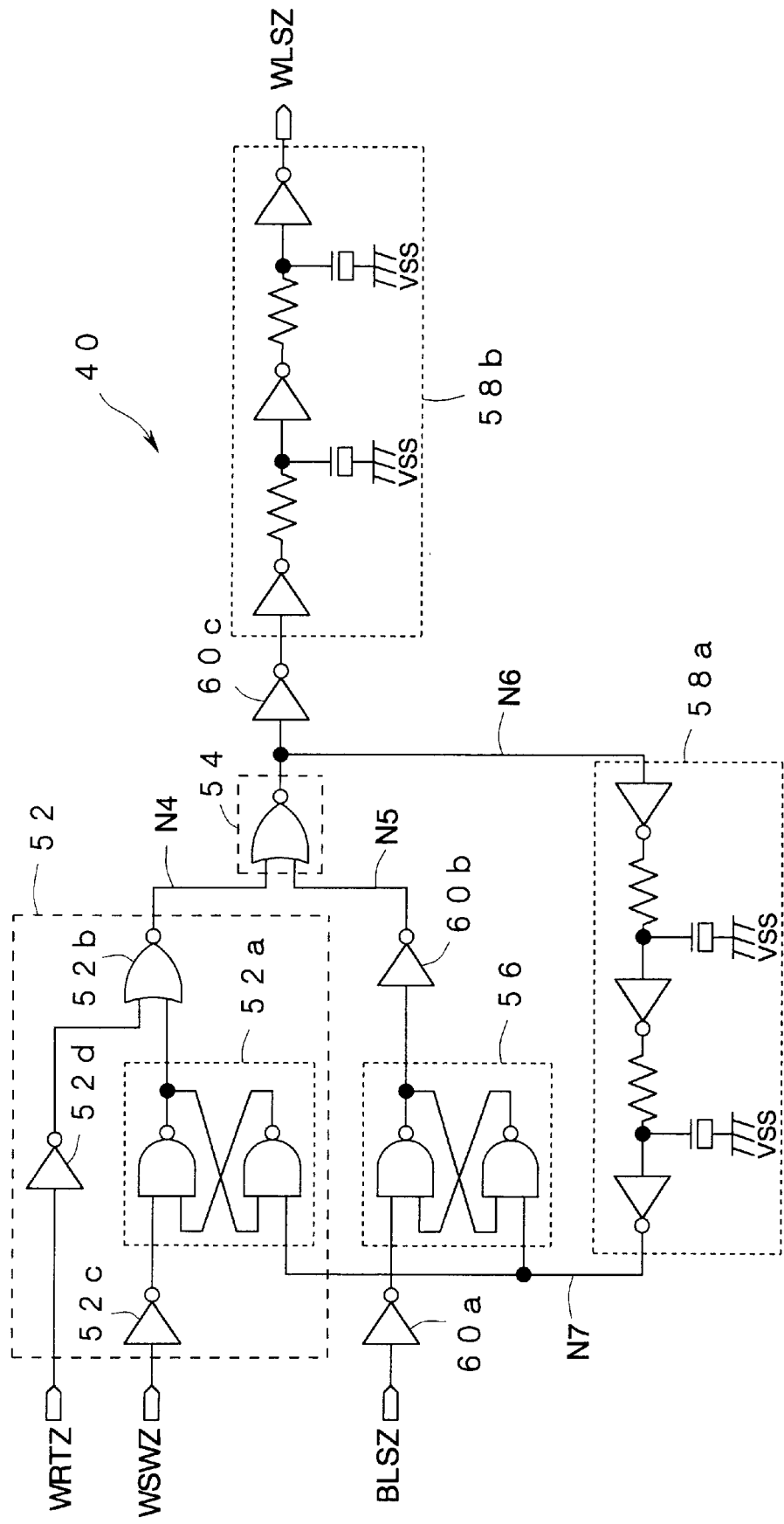
FIG. 12 is a circuit diagram showing the main parts of the word line activating timing generator of FIG. 9.

FIG. 12 shows the main parts of the word line activating timing generator 40.

The word line activating timing generator 40 has a write data monitoring part 52, a logic synthesis part 54 consisting of a two-input NOR gate, a flip-flop 56, delay circuits 58a and 58b, and inverters 60a, 60b, and 60c. The write data monitoring part 52 corresponds to the first controlling circuit. The output signal of the write data monitoring part 52 (node N4) corresponds to the first activating signal. The flip-flop 56 corresponds to the second controlling circuit. The output signal of the flip-flop 56 (node N5) corresponds to the second activating signal.

The flip-flop 56 is the same circuit as the flip-flop 44 shown in FIG. 10. The delay circuits 58a and 58b have the same logic as that of the delay circuit 42 shown in FIG. 10. The delay times of the delay circuits 58a and 58b are determined by the resistances and capacitances of the CR time constant circuits.

The write data monitoring part 52 has a flip-flop 52a, a 2-input NOR gate 52b, and inverters 52c and 52d. The flip-flop 52a is the same circuit as the flip-flop 56. An input of the flip-flop 52a receives the inverted signal of the write switching signal WSWZ through the inverter 52c. The other input of the flip-flop 52a is connected to a node N7. The inputs of the NOR gate 52b are connected to the inverted logic of the write command signal WRTZ through the inverter 52d and to the output of the flip-flop 52. The output of the NOR gate 52b is connected to the node N4. The write data monitoring part 52 is a circuit for delaying the activation of the word line activating signal WLSZ for a predetermined time upon the activation of the write switching signal WSWZ and the write command signal WRTZ in a write operation.

The inputs of the logic synthesis part 54 are connected to the node N4, that is, the output of the write data monitoring part 52 and to the node N5, that is, the inverted logic of the flip-flop 56 through the inverter 60b. A node N6, the output of the logic synthesis part 54, is connected to the inputs of the inverter 60c and the delay circuit 58a. The logic synthesis part 54 is a circuit for performing an AND operation of negative logic. That is, the logic synthesis part 54 outputs high level when detecting the low levels of both the node N4 and the node N5.

An input of the flip-flop 56 is connected to the inverted logic of the bit line activating signal BLSZ through the inverter 60a. The other input of the flip-flop 56 is connected to the node N7, the output of the delay circuit 58a. The delay circuit 58b receives the output of the inverter 60c and outputs the word line activating signal WLSZ.

The word line activating timing generator 40 includes a circuit for receiving the basic signal BRASZ and generating the word line inactivating signal WLRZ, aside from the circuits shown in FIG. 12.

Next, the operation of the above-described FCRAM will be explained.

Figure 13:
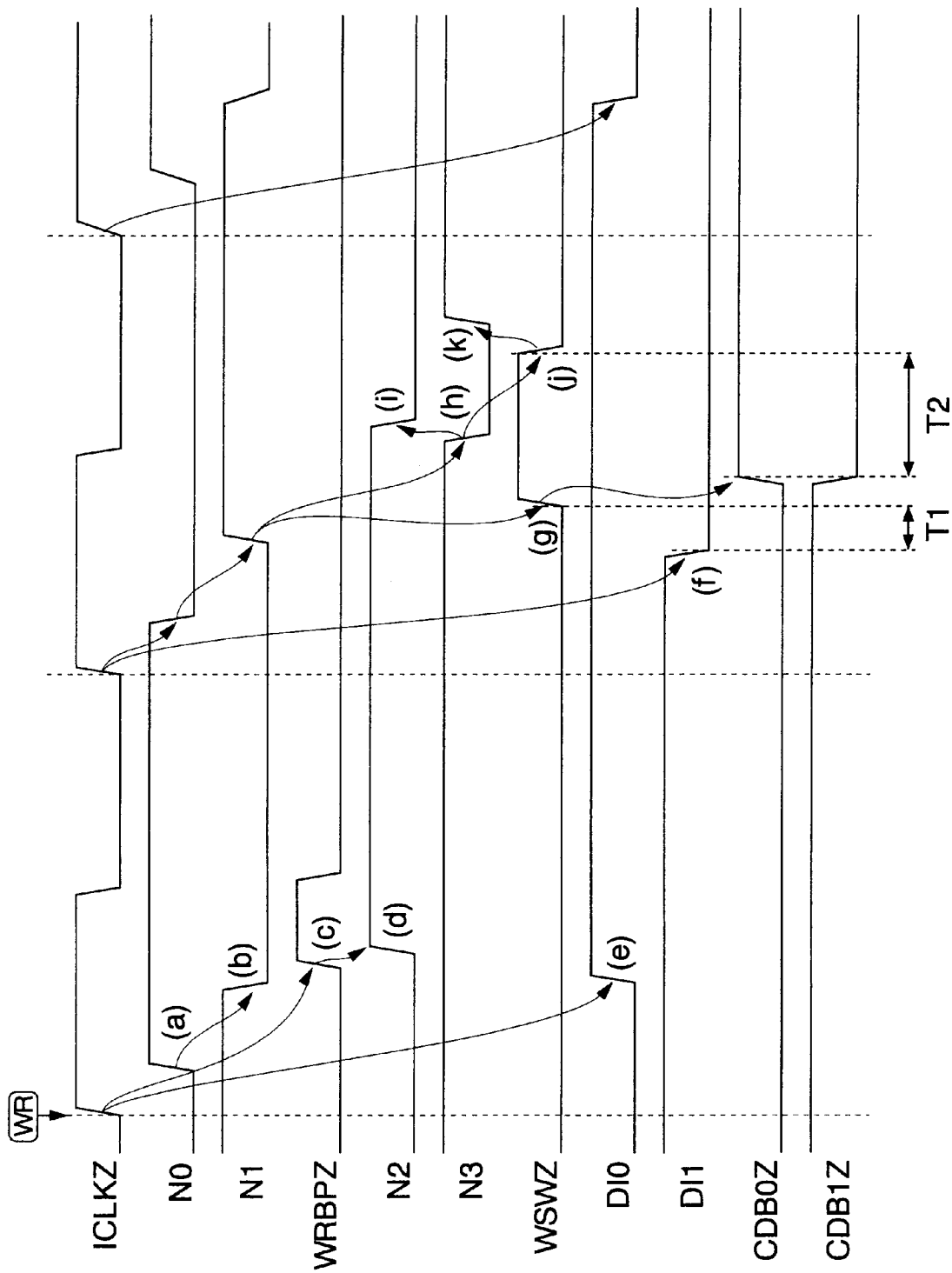
FIG. 13 is a timing chart showing the operation of the serial/parallel controlling circuit and the serial/parallel conversion circuit.

FIG. 13 shows the operating timing for the serial/parallel controlling circuit 36 and the serial/parallel conversion circuit 38.

The frequency divider 36d shown in FIG. 10 receives the internal clock signal ICLKZ, and frequency-divides the signal for output to the node N0 (FIG. 13(a)). The delay circuit 42 delays the signal from the node N0 for a predetermined time and inverts the same for output to the node N1 (FIG. 13(b)). The clock buffer 6 shown in FIG. 9 accepts the command signal CMD in synchronization with the rise of the internal clock signal ICLKZ. The command decoder 34 decodes the received data for the write command WR, and outputs the write command signal WRBPZ (FIG. 13(c)).

The flip-flop 44 shown in FIG. 10 receives the write command signal WRBPZ, and turns the node N2 to high level (FIG. 13(d)). Then, the DQ buffer 10 shown in FIG. 9 sequentially accepts the write data as the internal data signals DI0 and DI0, in synchronization with the rises of the internal clock signal ICLKZ (FIG. 13(e), (f)).

The high level of the node N1 activates the write switching signal WSWZ (FIG. 13(g)). The serial/parallel conversion circuit 38 shown in FIG. 11 latches the internal data signals DI0 and DI1 in synchronization with the rise of the write switching signal WSWZ, and outputs the signals as the common data signals CDB0Z and CDB1Z. In other words, the write data input in the form of serial data are turned into the parallel data. Here, it is the delay time of the delay circuit 42 that secures the timing margin T1 between the supply of the internal data signal DI1 to the serial/parallel conversion circuit 38 and the activation of the write switching signal WSWZ.

After the delay time of the delay circuit 46 since the turning-high of the node N1, the node N3 is turned to low level (FIG. 13(h)). The low level of the node N3 resets the flip-flop 44, whereby the node N2 is turned to low level and the write switching signal WSWZ is inactivated (FIG. 13(i), (j)). Here, the timing margin T2 between the output of the common data signals CDB0Z, CDB1Z from the serial/parallel conversion circuit 38 and the inactivation of the write switching signal WSWZ is secured by the delay time of the delay circuit 46. The inactivation of the write switching signal WSWZ turns the node N3 to high level (FIG. 13(k)).

The serial/parallel controlling circuit 36 generates the write switching signal WSWZ by using the delay circuit 42 and the delay circuit 46. Therefore, the delay times can be adjusted to easily secure the timing margins of the write switching signal WSWZ with respect to the internal data signals DI0, DI1 and the common data signals CDB0Z, CDB1Z.

Figure 14:
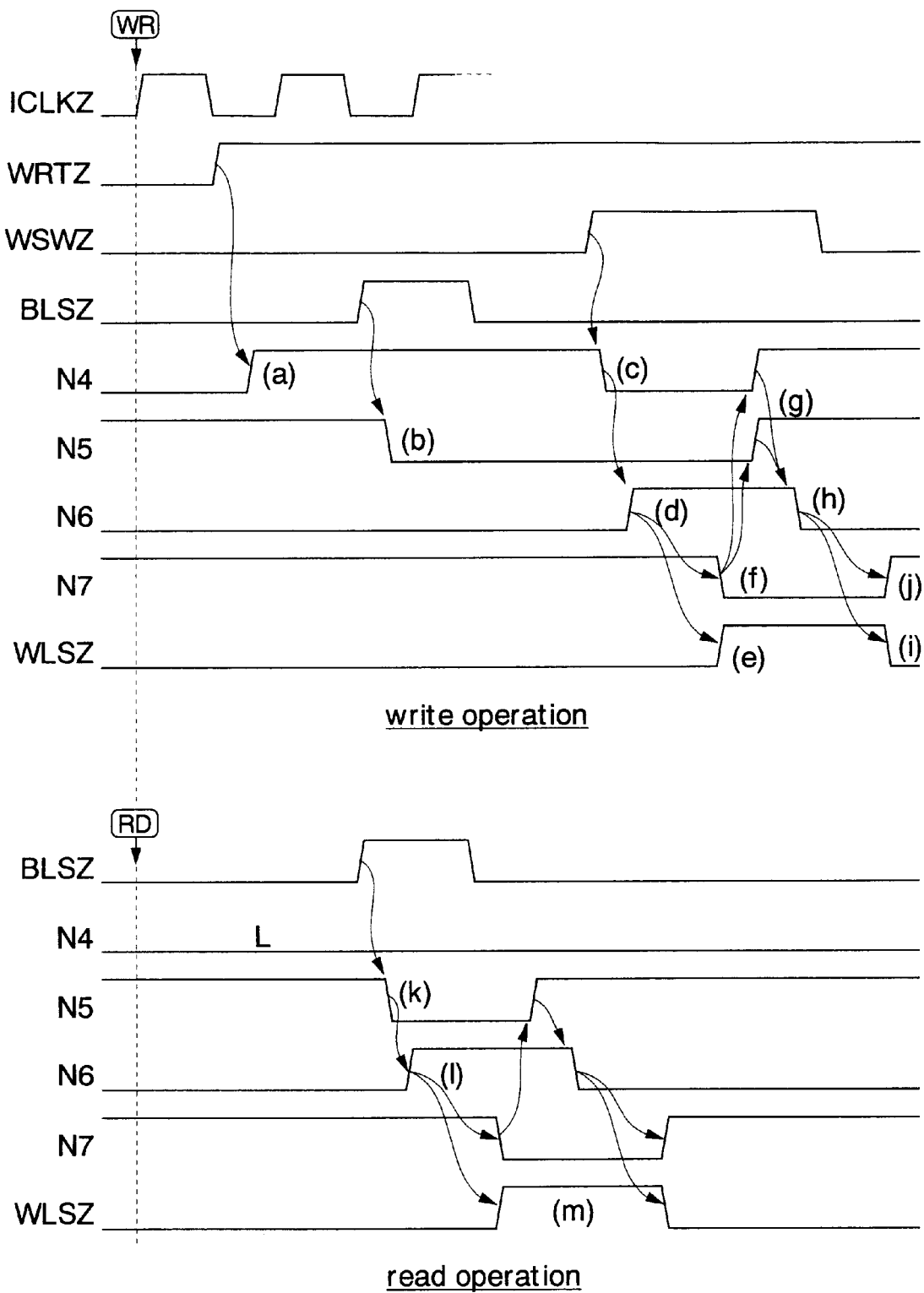
FIG. 14 is a timing chart showing the operation of the word line activating timing generator.

FIG. 14 shows the operating timing for the word line activating timing generator 40 in write and read operations.

In a write operation, the write data monitoring part 52 shown in FIG. 12 receives the high level of the write command signal WRTZ in synchronization with the acceptance of the write command WR, and turns the node N4 to high level (FIG. 14(a)). Besides, the flip-flop 56 is set in response to the high level of the bit line activating signal BLSZ, thereby turning the node N5 to low level (FIG. 14(b)).

Then, the write data monitoring part 52 receives the high level of the write switching signal WSWZ, sets the flip-flop 52a, and turns the node N4 to low level (FIG. 14(c)). The logic synthesis part 54 receives the low level of the node N4, and turns the node N6 to high level (FIG. 14(d)).

The high level of the node N6 activates the word line activating signal WLSZ (FIG. 14(e)). In other words, the word line activating signal WLSZ is activated in synchronization with the write switching signal WSWZ. The high level of the node N6 also turns the node N7 to low level (FIG. 14(f)).

The flip-flop 52a is reset in response to the low level of the node N7, turning the node N4 to high level. The flip-flop 56 is reset in response to the low level of the node N7, turning the node N5 to the low level (FIG. 14(g)). The logic synthesis part 54 receives the high levels of the nodes N4 and N5, and turns the node N6 to low level (FIG. 14(h)).

The low level of the node N6 inactivates the word line activating signal WLSZ (FIG. 14(i)). The low level of the node N6 also turns the node N7 to high level (FIG. 14(j)).

Meanwhile, in a read operation, the write command signal WRTZ is not activated, and therefore the node N4 retains its low level.

The flip-flop 56 is set in response to the high level of the bit line activating signal BLSZ, turning the node N5 to low level (FIG. 14(k)). The logic synthesis part 54 receives the low level of the node N5, and turns the node N6 to high level (FIG. 14(l)). In other words, the node N6 is turned to the high level in synchronization with the bit line activating signal BLSZ. Subsequently, as in a write operation, the word line activating signal WLSZ is activated at predetermined timing (FIG. 14(m)).

As described above, the word line activating signal WLSZ is activated in synchronization with the write switching signal WSWZ in a write operation, and is activated in synchronization with the bit line activating signal BLSZ in a read operation. This is attributed to the logic synthesis part 54 transmitting the logic of the node N4 to the node N6 in a write operation and transmitting the logic of the node N5 to the node N6 in a read operation.

Figure 15:
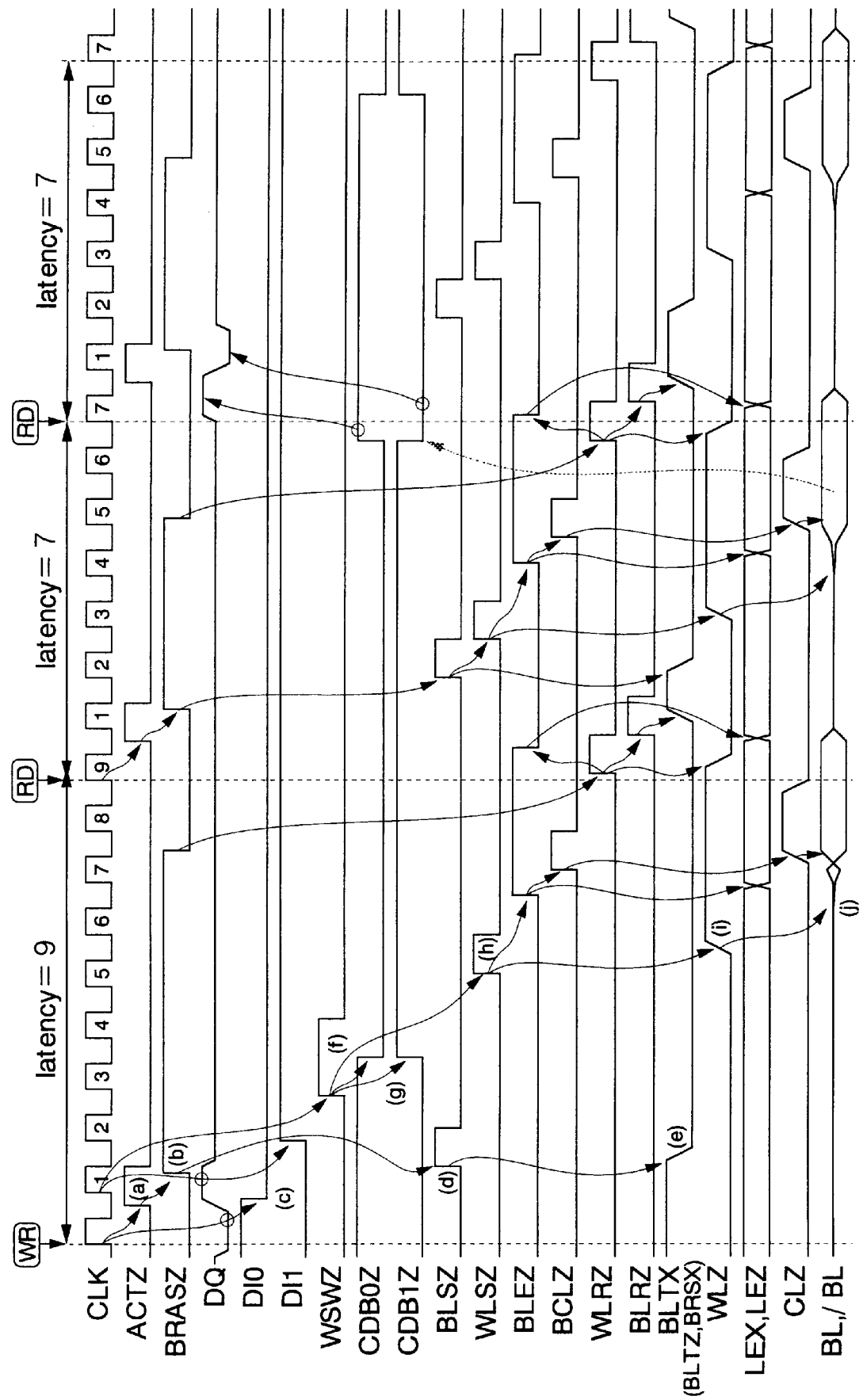
FIG. 15 is a timing chart for execution of a write operation before read operations in the first embodiment.

FIG. 15 shows the timing for execution of a write operation before read operations. In this example, two-bit serial data are being written consecutively.

Initially, the input buffer 6 shown in FIG. 9 accepts the command signal CMD (the write command WR) in synchronization with the rise of the internal clock signal ICLKZ. The command decoder 34 receives the internal command signal ICMD, and activates the command activating signal ACTZ (FIG. 15(a)). The command decoder 34 also activates the write command signals WRBPZ and WRTZ (not shown). The RASZ generator 8 receives the command activating signal ACTZ and activates the basic signal BRASZ (FIG. 15(b)). The DQ buffer 10 sequentially accepts the data signals DQ in synchronization with the rises of the internal clock signal ICLKZ, and outputs the same in the form of the internal data signals DI0 and DI1 (FIG. 15(c)).

The signal BRASZ, and activates the bit line activating signal BLSZ for a predetermined period (FIG. 15(d)). In other words, the bit line activating signal BLSZ is activated earlier compared to the prior art. The BLT generator 16 receives the bit line activating signal BLSZ, and activates the bit line controlling signal BLTX and the bit line controlling signal BRSX (FIG. 15(e). The activation of the bit line controlling signal BLTX terminates the equalization and the precharging operation to the bit lines BL and /BL.

The serial/parallel controlling circuit 36 shown in FIG. 9 detects the rising edge of the internal clock signal ICLKZ after the reception of the write command WR, and activates the write switching signal WSWZ (FIG. 15(f)).

The serial/parallel conversion circuit 38 accepts the internal data signals DI0 and DI1 in synchronization with the write switching signal WSWZ, executes serial/parallel conversion thereto, and output the resultants as the common data signals CDB0Z and CDB1Z, respectively (FIG. 15(g)).

The word line activating timing generator 40 receives the write switching signal WSWZ, and activates the word line activating signal WLSZ for a predetermined period (FIG. 15 (h)). Here, since the bit line controlling signal BLT has already been activated, the write switching signal WSWZ can directly activate the word line activating signal WLSZ. This makes the activating timing of the word activating signal WLSZ approximately one clock earlier compared to the prior art.

The main-word decoder 17 receives the word line activating signal WLSZ, and activates the word line signal WLZ (FIG. 15(i)). Due to the activation of the word line signal WLZ, the data retained in the memory cell 21 are output to the bit lines BL and /BL in the form of a weak signal (FIG. 15 (j)).

Subsequently, under the same timing as that of the prior art, the sense amplifier activating signals LEX and LEZ, and the column line signal CLZ are activated/inactivated, and the bit line controlling signals BLTX, BLTZ, and BRSX, and the word line signal WLZ are inactivated to execute the write operation. As described above, since the activating timing of the word line activating signal WLSZ becomes earlier by approximately one clock, the number of clocks needed for one write operation is one clock fewer compared to the prior art, that is, nine (latency=9).

Then, under the same timing as that of the prior art, the bit line controlling signals BLTX, BLTZ, and BRSX, the word line signal WLZ, the sense amplifier activating signals LEX and LEZ, and the column line signal CLZ are activated/inactivated to execute the read operations.

As has been described above, in the semiconductor integrated circuit of the present invention, the bit line activating signal BLSZ, a controlling signal for the memory core unit 4, is activated in synchronization with the acceptance of the write command WR. On this account, the word line activating signal WLSZ, another controlling signal for the memory core unit 4, can be directly activated by the write switching signal WSWZ. Therefore, the inactivating timing of the word line activating signal WLSZ, the sense amplifier activating timing signal BLEZ, and the column line signal CLZ can be advanced by approximately one clock. As a result, the number of clocks required for the write operation before a read operation may be one clock fewer compared to the prior art, that is, nine.

The word line activating signal WLSZ, the sense amplifier activating timing signal BLEZ, and the column line signal CLZ are sequentially activated by using the data accepting signal WSWZ. This makes it possible to surely activate these controlling signals WLSZ, BLEZ, and CLZ without generating a new controlling signal.

The output node N4 of the write data monitoring part 52 and the output-inverted node N5 of the flip-flop 56 are performed the logical operation by the logic synthesis part 54 to generate the word line activating signal WLSZ. This allows easy generation of the word line activating signal WLSZ whose timing varies with write and read operations.

Figure 16:
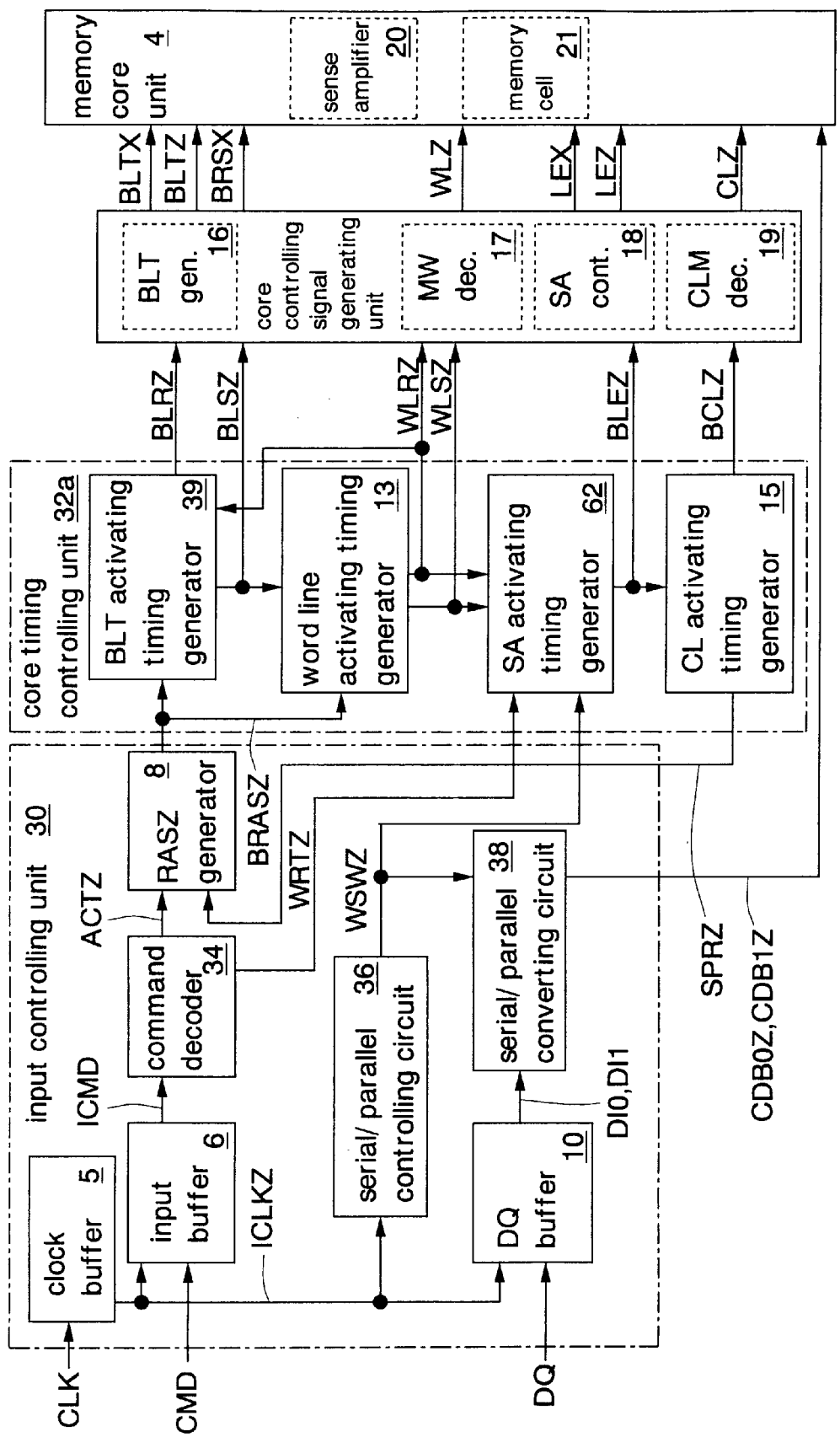
FIG. 16 is a block diagram showing the circuit associated with the write operations in a second embodiment.

FIG. 16 shows the configurations of the main parts associated with the write operations in a second embodiment of the semiconductor integrated circuit in the present invention.

In the FCRAM of this embodiment, the write command signal WRTZ output from a command decoder 34 and the write switching signal WSWZ output from a serial/parallel controlling circuit 36 are output to an SA activating timing generator 62. The circuit configurations and signal connections except those of the SA activating timing generator 62 and a word line activating timing generator 13 are identical to those of the first embodiment. A core timing controlling unit 32a corresponds to the controlling signal generating unit 22 shown in FIG. 8.

Figure 17:
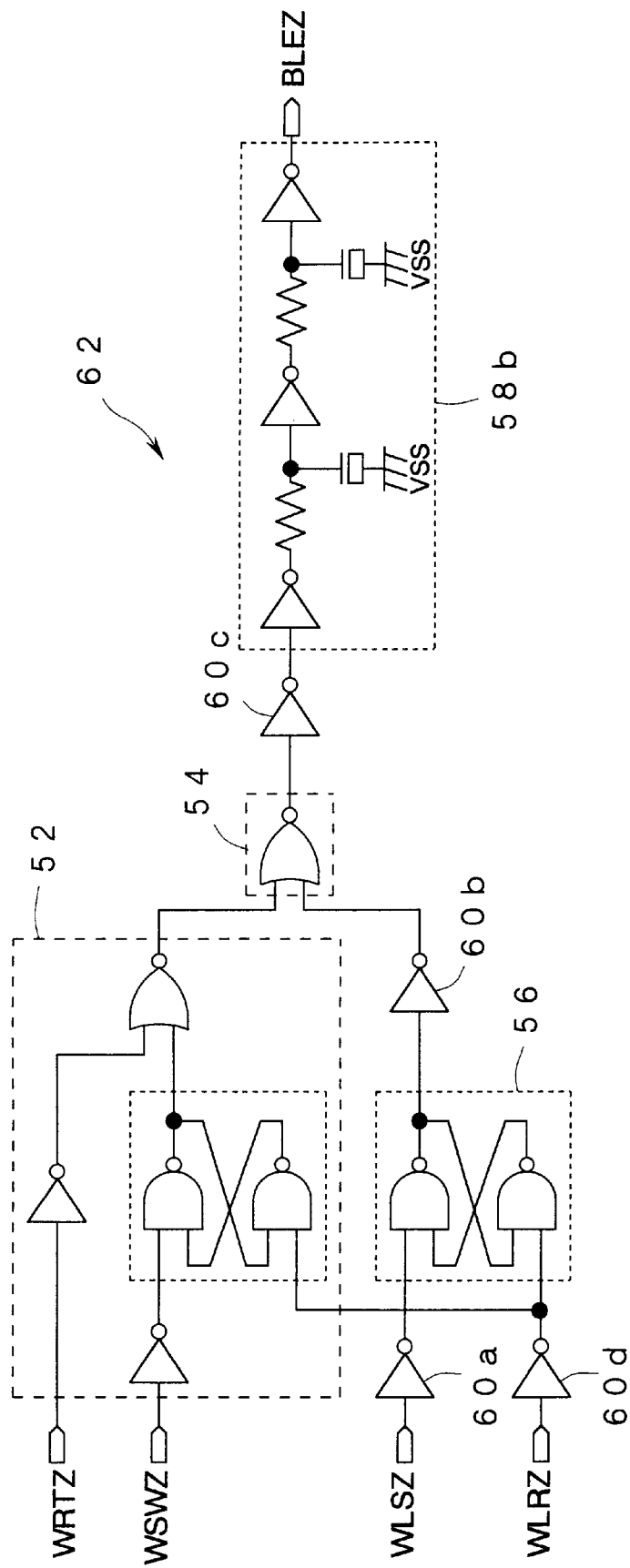
FIG. 17 is a circuit diagram showing the SA activating timing generator of FIG. 16.

FIG. 17 shows the SA activating timing generator 62.

The SA activating timing generator 62 has almost the same circuit configuration as that of the word line activating timing generator 40 shown in FIG. 12. More specifically, the SA activating timing generator 62 has a write data monitoring part 52, a logic synthesis part 54, a flip-flop 56, a delay circuit 58b, and inverters 60a, 60b, 60c, and 60d.

The write data monitoring part 52 receives a write command signal WRTZ, a write switching signal WSWZ, and a word line inactivating signal WLRZ through the inverter 60d. An input of the flip-flop 56 receives a word line activating signal WLSZ through the inverter 60a. The other input of the flip-flop 56 receives a word line inactivating signal WLRZ through the inverter 60d. The delay circuit 58b outputs a sense amplifier inactivating signal BLEZ.

The SA activating timing generator 62 is a circuit for operating the write data monitoring part 52 to delay the activation of the sense amplifier activating signal BLEZ for a predetermined time in a write operation.

Next, the operation of the above-described FCRAM will be explained.

Figure 18:
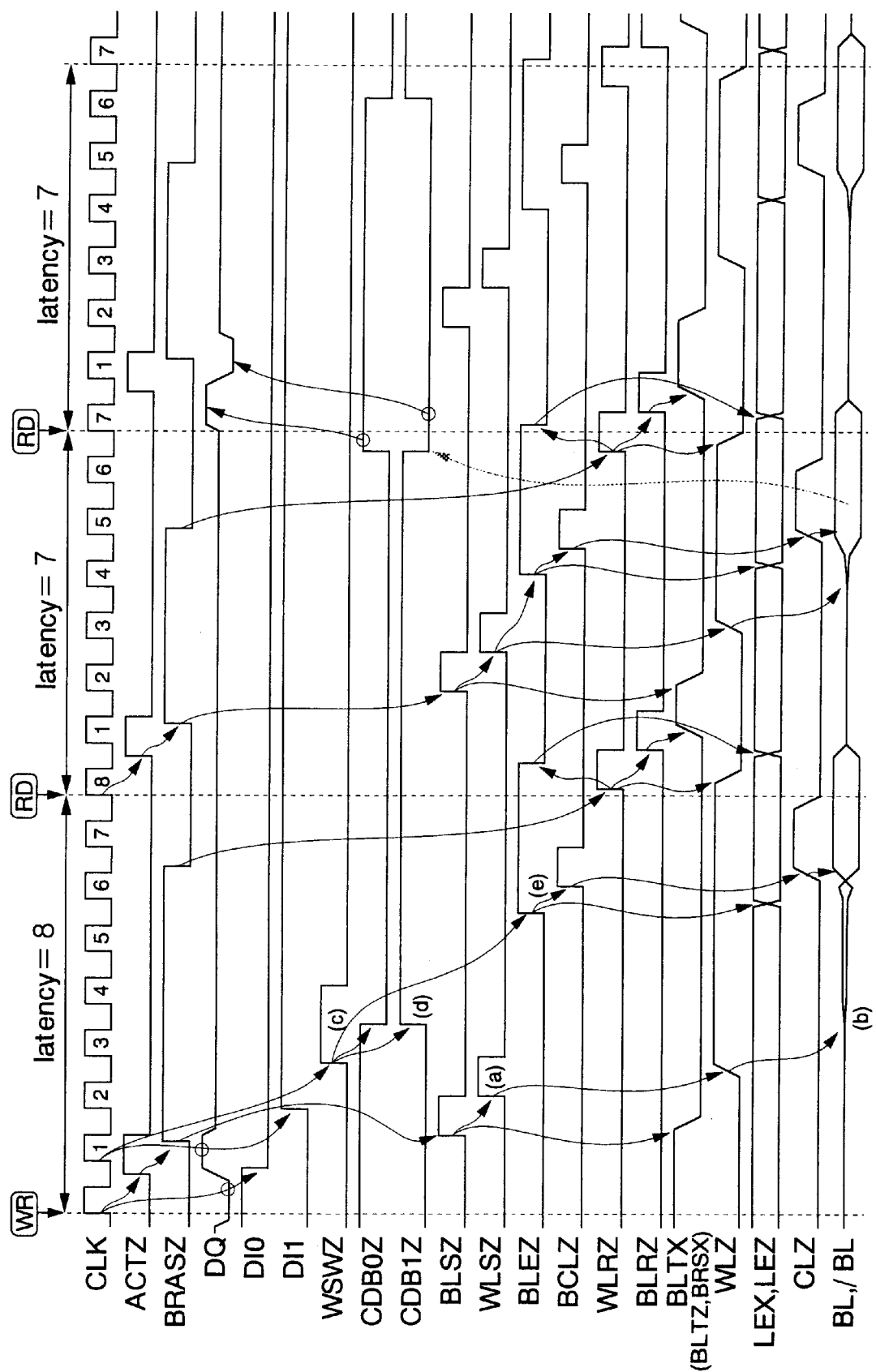
FIG. 18 is a timing chart for execution of a write operation before read operations in the second embodiment.

FIG. 18 shows the timing of execution of read operations after a write operation. In this example, 2-bit serial data are being written consecutively.

Initially, as in FIG. 15, the command activating signal ACTZ, the basic signal BRASZ, the bit line activating signal BLSZ, and the bit line controlling signals BLTX and BRSX are activated.

Then, the word line activating timing generator 13 shown in FIG. 16 receives the bit line activating signal BLSZ, and activates the word line activating signal WLSZ (FIG. 18(a)). That is, the bit line activating signal BLSZ and the word line activating signal WLSZ are activated earlier compared to that of the prior art. The main-word decoder 17 receives the word line activating signal WLSZ, and activates the word line signal WLZ (FIG. 18(b)).

The serial/parallel controlling circuit 36 shown in FIG. 16 detects the rising edge of the internal clock signal ICLKZ after the reception of the write command WR, and activates the write switching signal WSWZ (FIG. 18(c)). The serial/parallel conversion circuit 38 accepts the internal data signals DI0 and DI1 in synchronization with the write switching signal WSWZ, executes serial/parallel conversion thereto, and outputs the resultants as the common data signals CDB0Z and CDB1Z, respectively (FIG. 18(d)). The SA activating timing generator 62 receives the write switching signal WSWZ, 30 and activates the sense amplifier activating timing signal BLEZ (FIG. 18(e)). Here, since the bit line activating signal BLSZ and the word line activating signal WLSZ have already been activated, the write switching signal WSWZ can directly activate the sense amplifier activating timing signal BLEZ. Accordingly, the activating timing of the sense amplifier activating timing signal BLEZ becomes approximately two clocks earlier compared to that of the prior art.

Subsequently, as in the first embodiment, the sense amplifier activating signals LEX and LEZ are activated, and the column line signal CLZ is activated for execution of the write operation. Then, the read operations are executed at the same timing as that of the prior art.

As has been described above, this embodiment can also offer the same effect as that obtained from the first embodiment described previously. Moreover, in this embodiment, the bit line activating signal BLSZ and the word line activating signal WLSZ are sequentially activated in synchronization the acceptance of the write command WR. This allows the sense amplifier activating timing signal BLEZ to be directly activated by the write switching signal WSWZ, whereby its activating timing is advanced by approximately two clocks. Therefore, the number of clocks required for the write operation before a read operation may be two clocks fewer compared to that of the prior art, that is, eight.

Figure 19:
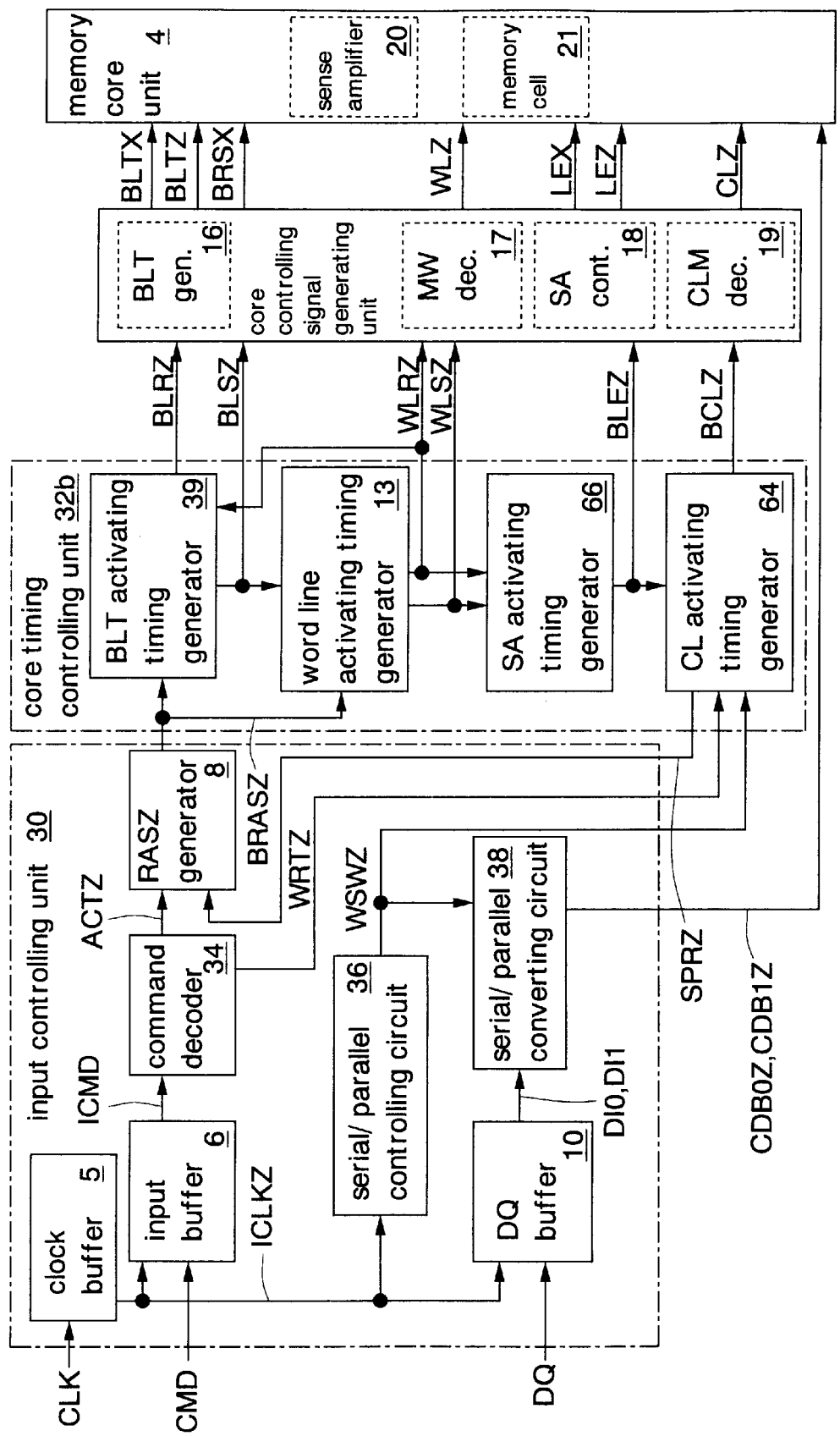
FIG. 19 is a block diagram showing the circuit associated with the write operations in the third embodiment.

FIG. 19 shows the configurations of the main parts associated with the write operations in a third embodiment of the semiconductor integrated circuit in the present invention.

In the FCRAM of this embodiment, the write command signal WRTZ output from a command decoder 34 and the write switching signal WSWZ output from a serial/parallel controlling circuit 36 are supplied to a CL activating timing generator 64. Besides, an SA activating timing generator 66 is different in circuit configuration from that of the first embodiment. The circuit configurations and signal connections excepting those of the SA activating timing generator 66 and the CL activating timing generator 64 are identical to those of the first embodiment. A core timing controlling unit 32b and the core controlling signal generating unit 3 correspond to the controlling signal generating unit 22 shown in FIG. 8.

Figure 20:
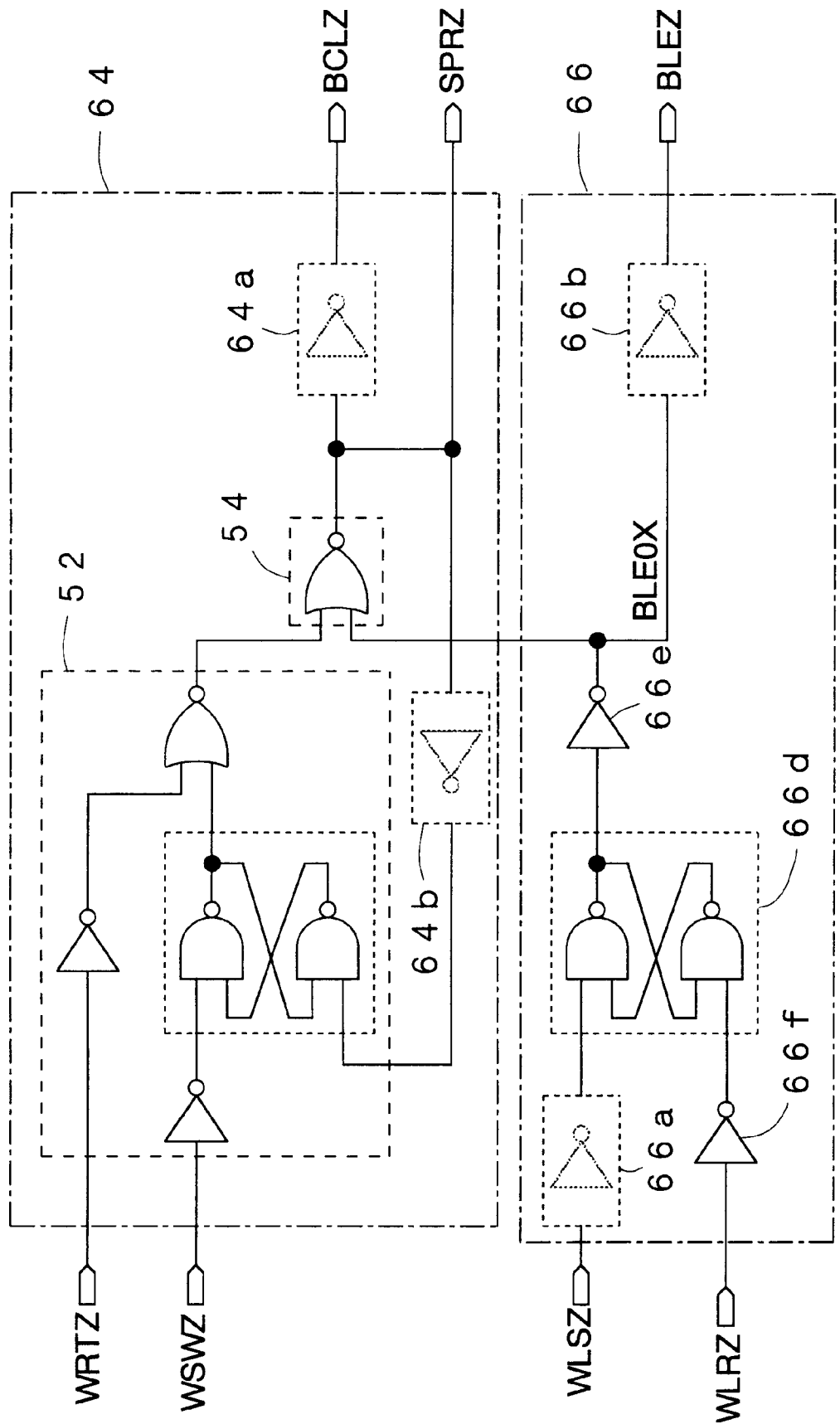
FIG. 20 is a circuit diagram showing the CL activating timing generator and the SA activating timing generator of FIG. 19.

FIG. 20 shows the CL activating timing generator 64 and the SA activating timing generator 66.

The CL activating timing generator 64 has a write data monitoring part 52, a logic synthesis part 54, and delay circuits 64a and 64b. The delay circuits 64a and 64b have the same logic as that of the delay circuit 42 shown in FIG. 10. The write data monitoring part 52 receives the write command signal WRTZ and the write switching signal WSWZ and receives the self-precharging signal SPRZ through the delay circuit 64b. The output of the write data monitoring part 52 is connected to an input of the logic synthesis part 54. The other input of the logic synthesis part 54 receives a sense amplifier activating timing signal BLE0X. The sense amplifier activating timing signal BLE0X corresponds to the second activating signal. The delay circuit 64a receives the output of the logic synthesis part 54, and outputs the inverted signal thereof as the column line activating signal BCLZ.

The SA activating timing generator 66 has delay circuits 66a and 66b, a flip-flop 66d, and inverters 66e and 66f. The flip-flop 66d corresponds to the second controlling circuit. The delay circuits 66a and 66b have the same logic as that of the delay circuit 42 shown in FIG. 10.

An input of the flip-flop 66d receives the word line activating signal WLSZ through the delay circuit 66a. The other input of the flip-flop 66d receives the word line inactivating signal WLRZ through the inverter 66f. The inverter 66e receives the output of the flip-flop 66d, and outputs the sense amplifier activating timing signal BLE0Z. The delay circuit 66c receives the sense amplifier activating timing signal BLE0X, and outputs the inverted signal thereof as the sense amplifier activating timing signal BLEZ.

Next, the operation of the above-described FCRAM will be explained.

Figure 21:
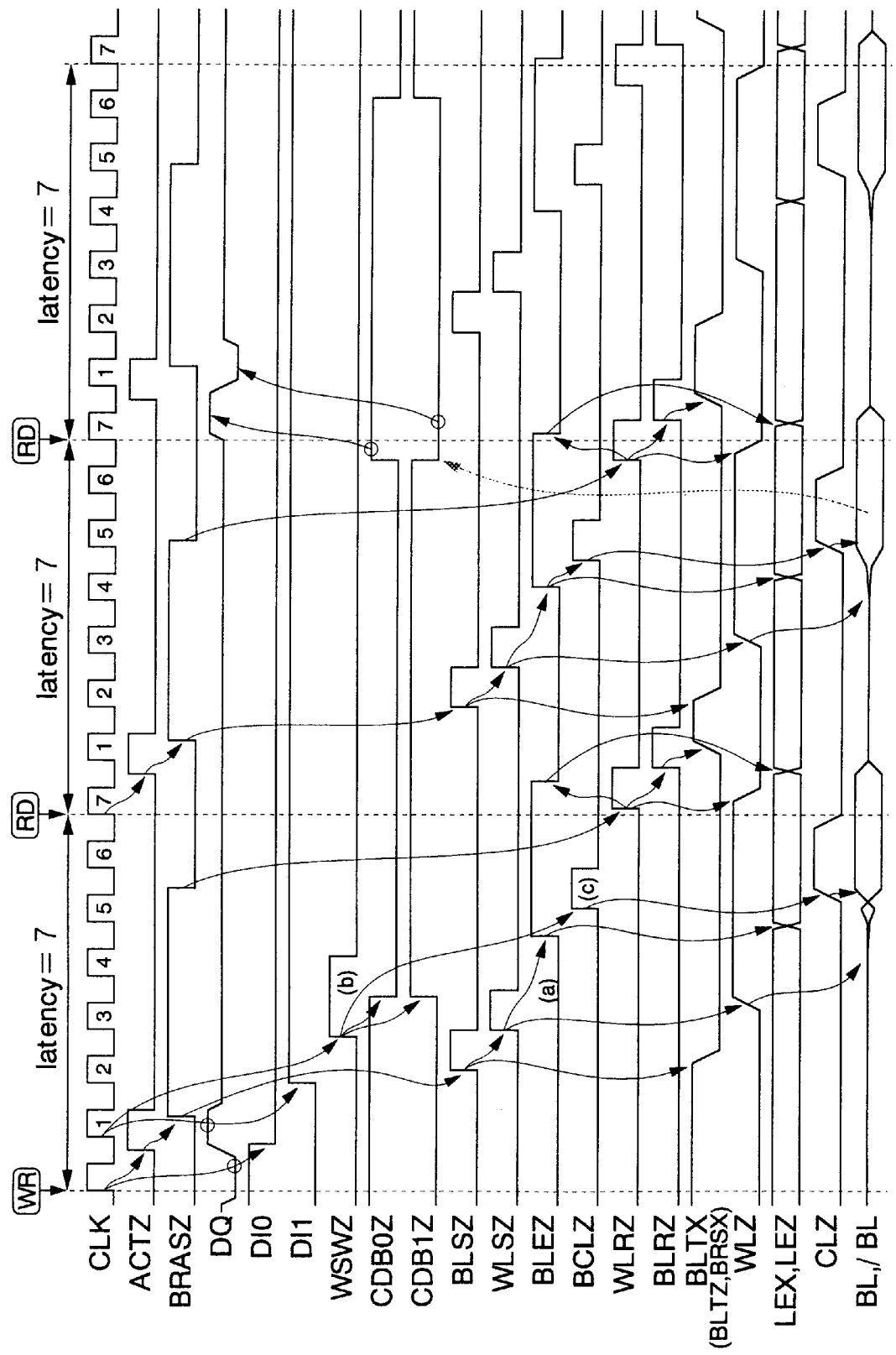
FIG. 21 is a timing chart for execution of a write operation before read operations in the third embodiment.

FIG. 21 shows the timing for execution of read operations after a write operation. In this example, two-bit serial data are being written consecutively.

Up to the activation of the word line activating signal WLSZ, the timing is identical to that of FIG. 18. Then, the SA activating timing generator 66 shown in FIG. 20 receives the word line activating signal WLSZ, and activates the sense amplifier activating timing signal BLEZ (FIG. 21(a)).

The serial/parallel controlling circuit 36 shown in FIG. 19 detects the rising edge of the internal clock signal ICLKZ after the reception of the write command WR, and activates the write switching signal WSWZ (FIG. 21(b)).

The CL activating timing generator 64 receives the write switching signal WSWZ, and activates the column line activating signal BCLZ (FIG. 21(c)). Here, since the bit line activating signal BLSZ, the word line activating signal WLSZ, and the sense amplifier activating timing signal BLEZ have already been activated, the write switching signal WSWZ can directly activate the column line activating signal BCLZ. On this account, the activating timing of the column line activating signal BCLZ becomes approximately three clocks earlier compared to that of the prior art.

Subsequently, as in the first embodiment, the column line signal CLZ is activated to execute the write operation. Then, the read operations are carried out under the same timing as that of the prior art.

As has been described above, the semiconductor integrated circuit of this embodiment can also offer the same effect as that obtained from the first embodiment described previously. Moreover, in this embodiment, the bit line activating signal BLSZ, the word line activating signal WLSZ, and the sense amplifier activating timing signal BLEZ are sequentially activated in synchronization with the acceptance of the write command WR. This allows the column line activating signal BCLZ to be directly activated by the write switching signal WSWZ, whereby its activating timing is advanced by approximately three clocks. Therefore, the number of clocks required for the write operation before a read operation may be three clocks fewer compared to that of the prior art, that is, seven. That is, every write operation in random accessing can be executed in the same number of clocks as that for read operations.

Figure 22:
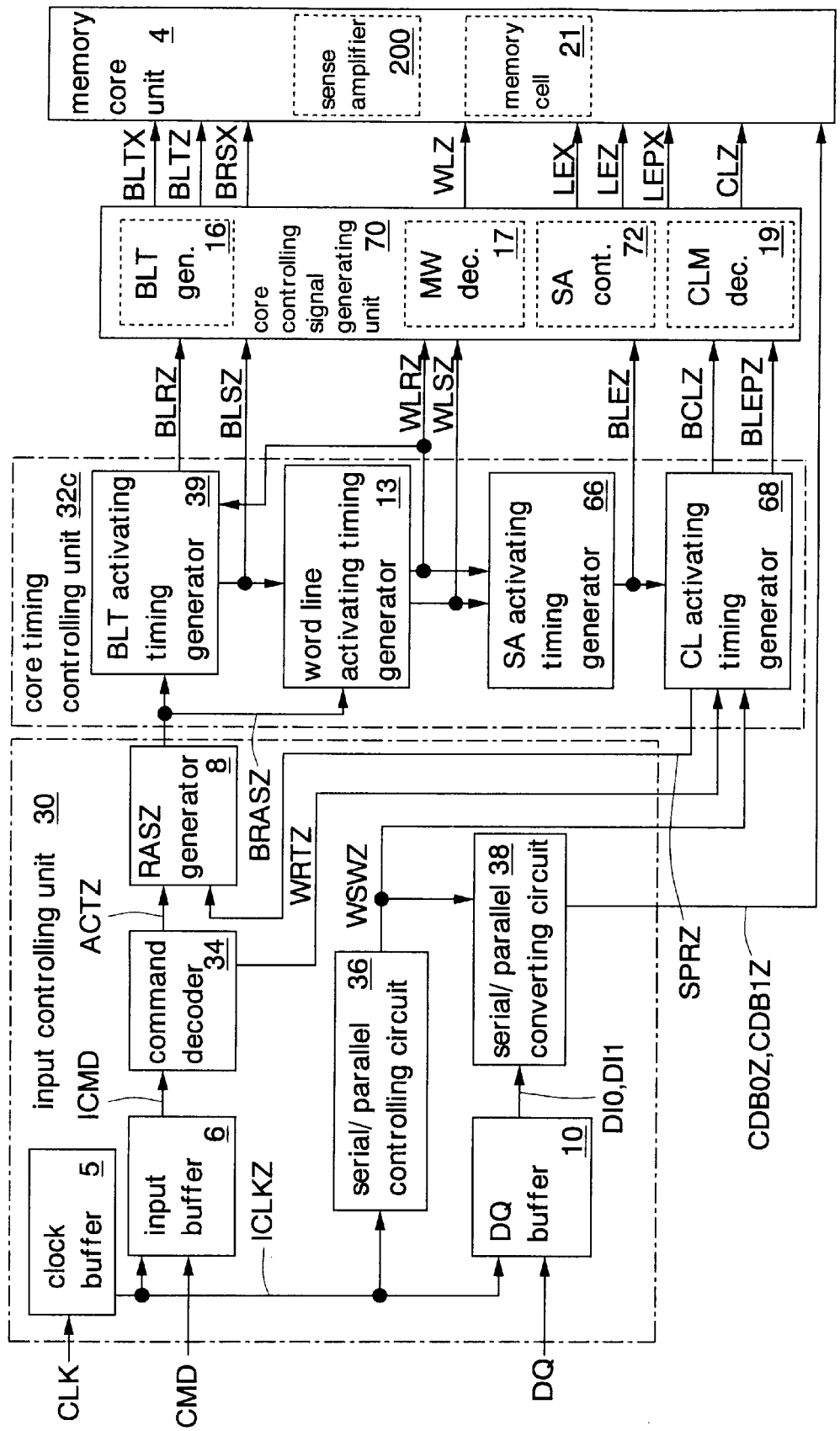
FIG. 22 is a block diagram showing the circuit associated with the write operations in the fourth embodiment.

FIG. 22 shows the configurations of the main parts associated with the write operations in a fourth embodiment of the semiconductor integrated circuit in the present invention.

Figure 5:
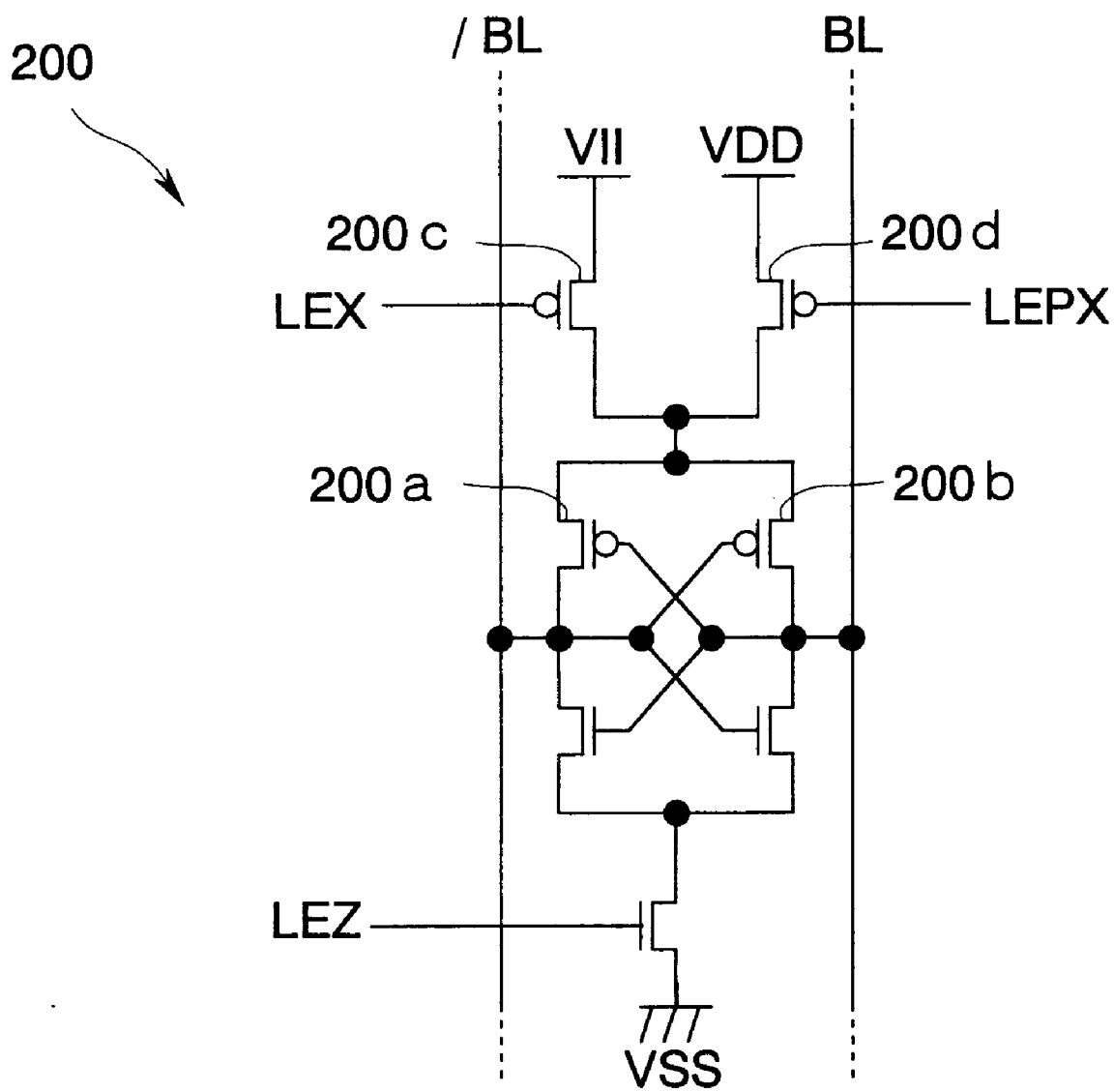
FIG. 5 is a circuit diagram showing a sense amplifier that has been proposed for the sake of reducing the amplifying time.
Figure 6:
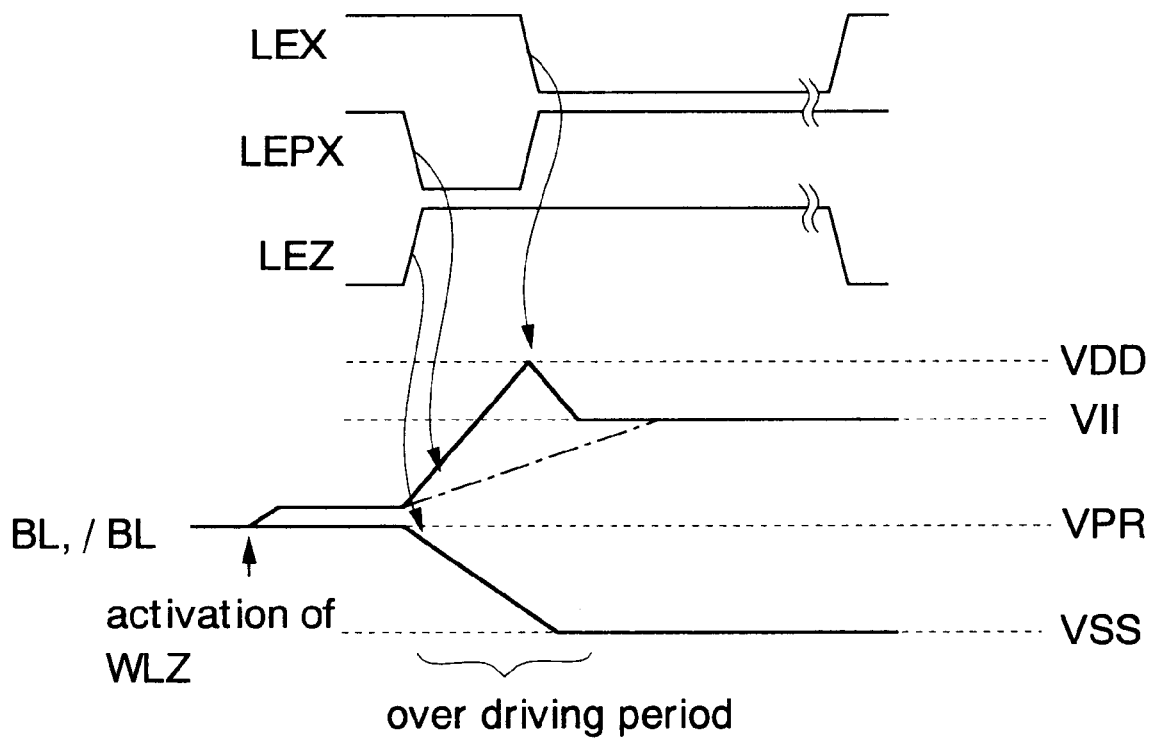
FIG. 6 is a timing chart showing the read amplifying operation in the sense amplifier of FIG. 5.
Figure 7:
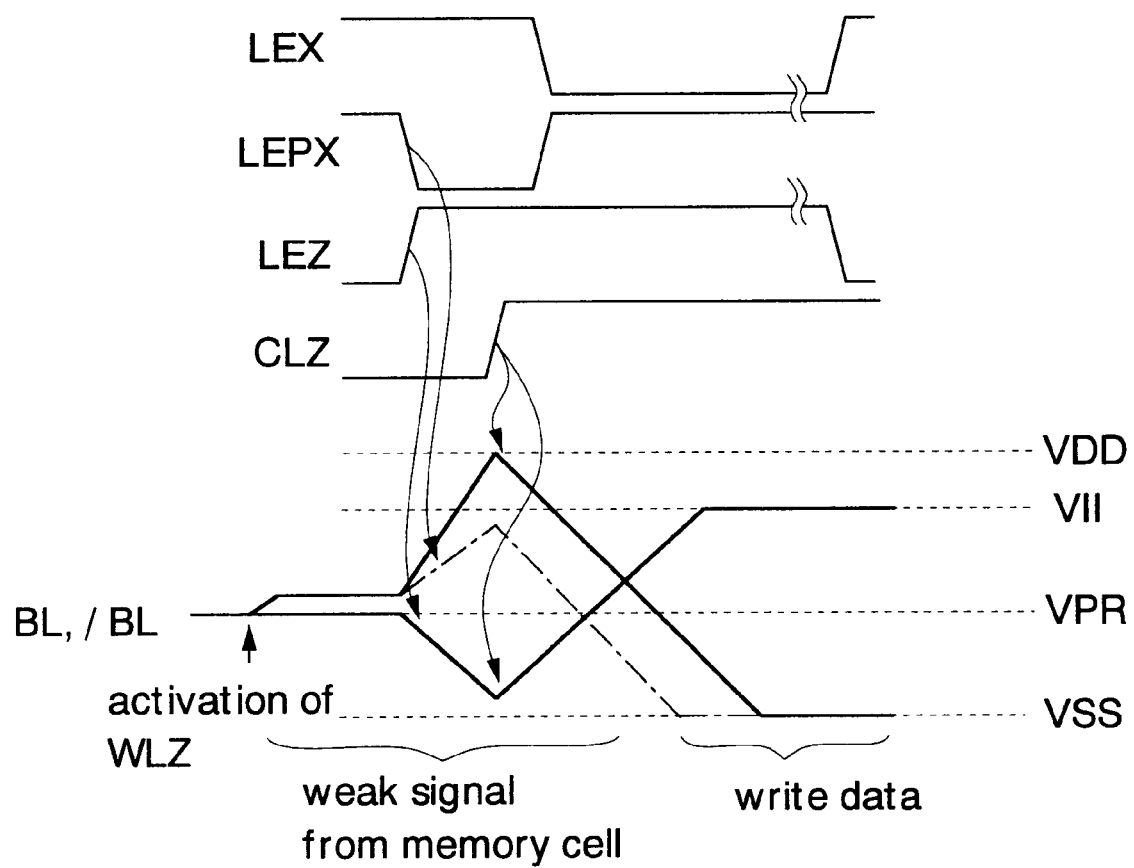
FIG. 7 is a timing chart showing the write amplifying operation in the sense amplifier of FIG. 5.

In the FCRAM of this embodiment, a CL activating timing generator 68 outputs a sense amplifier activating timing signal BLEPZ along with the column line activating signal BCLZ In addition, a sense amplifier controller 72 in a core controlling signal generating unit 70 outputs a sense amplifier activating signal LEPX along with the sense amplifier activating signals LEX and LEZ. A sense amplifier 200 is the same as the sense amplifier 200 shown in FIG. 5. The circuit configurations and signal connections excepting those of the CL activating timing generator 68, the sense amplifier controller 72, and the sense amplifier 200 are identical to those of the third embodiment. A core timing controlling unit 32c and the core controlling signal generating unit 70 correspond to the controlling signal generating unit 22 shown in FIG. 8.

Figure 23:
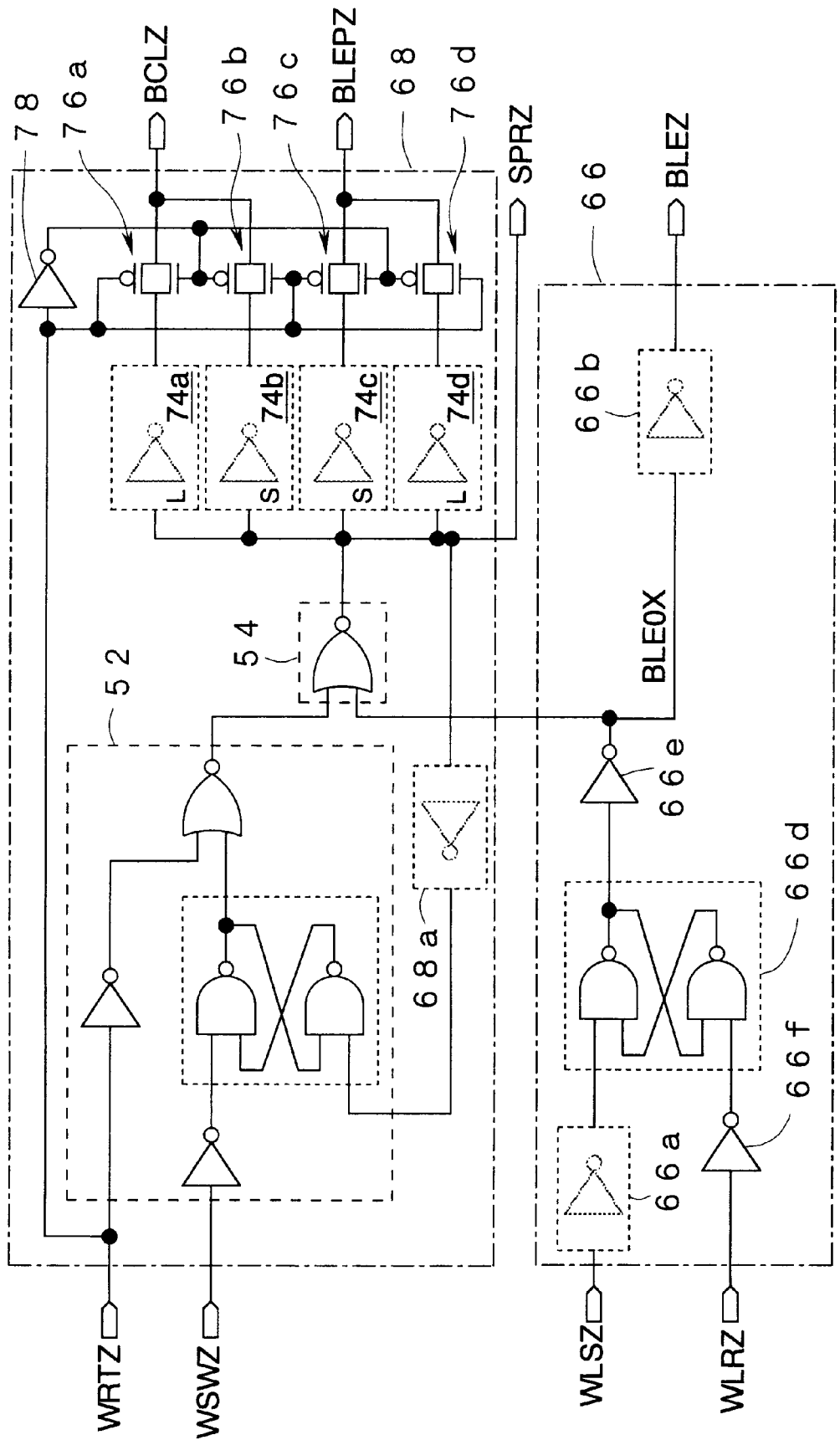
FIG. 23 is a circuit diagram showing the CL activating timing generator and the SA activating timing generator in the fourth embodiment.

FIG. 23 shows the CL activating timing generator 68 and the SA activating timing generator 66.

The CL activating timing generator 68 has a write data monitoring part 52, a logic synthesis part 54, delay circuits 68a, 74a, 74b, 74c, and 74d, CMOS transmission gates 76a, 76b, 76c, and 76d, and an inverter 78.

The write data monitoring part 52 receives the write command signal WRTZ and the write switching signal WSWZ. The write data monitoring part 52 also receives through the delay circuit 68a the self-precharging signal SPRZ, the output signal of the logic synthesis part 54. The output of the write data monitoring part 52 is connected to an input of the logic synthesis part 54. The other input of the logic synthesis part 54 receives the sense amplifier activating timing signal BLE0X. The delay circuits 74a, 74b, 74c, and 74d receive the self-precharging signal SPRZ, or the output signal of the logic synthesis part 54, and output the inverted signal thereof to the CMOS transmission gates 76a, 76b, 76c, and 76d, respectively.

The CMOS transmission gates 76a and 76b output the column line activating signal BCLZ. The CMOS transmission gates 76c and 76d output the sense amplifier activating timing signal BLEPZ. The gates of the pMOSs in the CMOS transmission gates 76a, 76c and the gates of the nMOSs in the CMOS transmission gates 76b, 76d receive the write command signal WRTZ. The gates of the nMOSs in the CMOS transmission gates 76a, 76c and the gates of the pMOSs in the CMOS transmission gates 76b, 76d receive the inverted signal of the write command signal WRTZ through the inverter 78.

The delay circuits 68a, 74a, 74b, 74c, and 74d have the same logic as that of the delay circuit 42 shown in FIG. 10. The delay circuits 74a and 74d are set at relatively longer delay time (represented by the subscripts "L" in the diagram), and the delay circuits 74b and 74c are set at relatively shorter delay time (represented by the subscripts "S" in the diagram). This makes the activating timing of the column line activating signal BCLZ earlier and the activating timing of the sense amplifier activating timing signal BLEPZ later in a write operation. As a result, the column line signal CLZ is activated earlier, while the activation is delayed of the sense amplifier activating signal LEPX for overdriving the sense amplifier.

Figure 24:
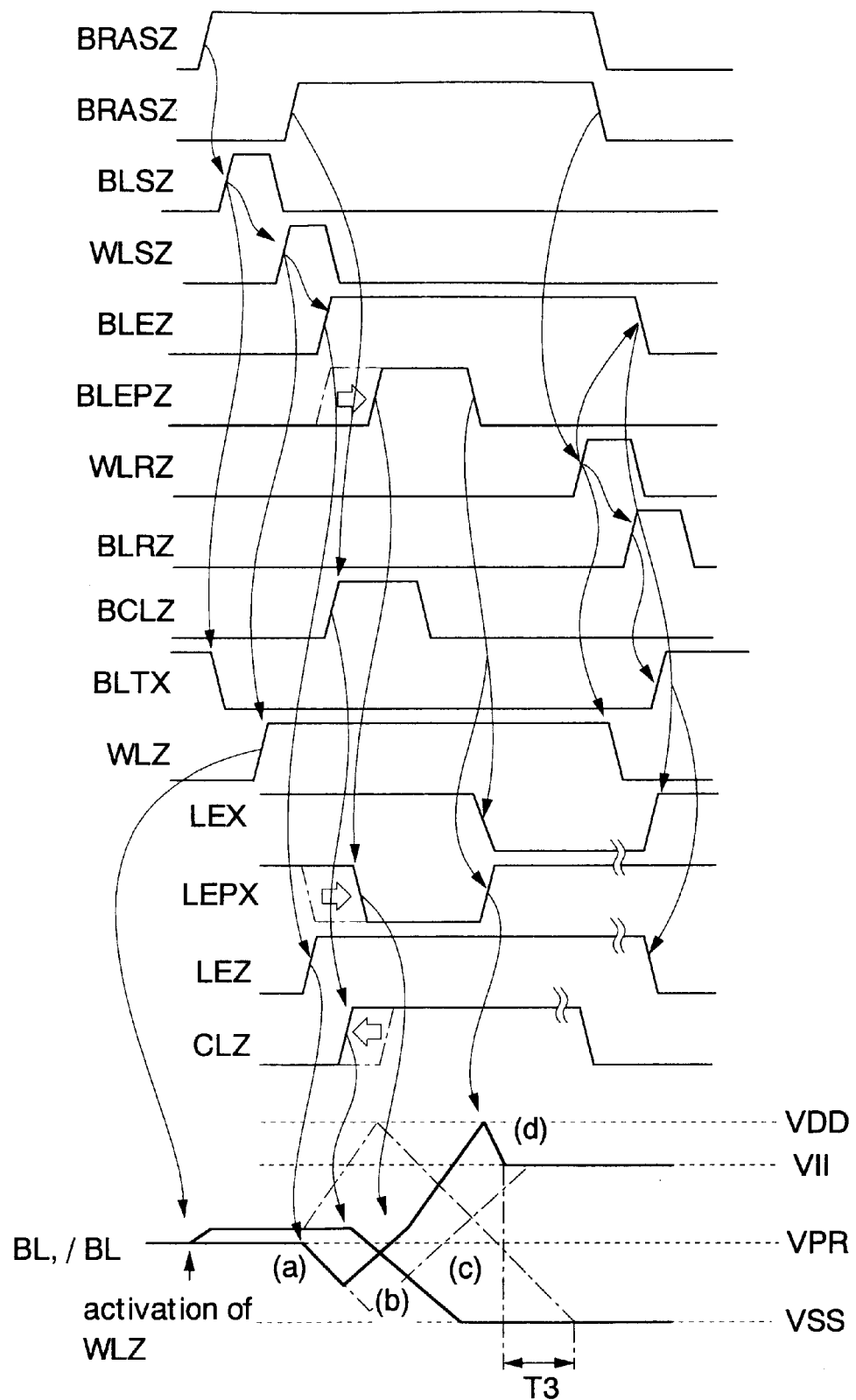
FIG. 24 is a timing chart for a write operation in the fourth embodiment.

FIG. 24 shows the timing for execution of a write operation.

Initially, as in the third embodiment, the bit line controlling signal BLTX is activated and then the word line signal WLZ is activated.

Next, due to the activation of the sense amplifier activating timing signal BLEZ, the sense amplifier activating signal LEZ is activated to start the amplification of the weak signal on the bit lines BL and /BL (FIG. 24(a)). Then, the column line signal CLZ is activated in response to the column line activating signal BCLZ, whereby write data are supplied to the bit lines BL and /BL (FIG. 24(b)). Here, the column line signal CLZ is activated earlier than that of the prior art (the chain line in the chart) by the delay circuit 74b in the CL activating timing generator 68 shown in FIG. 23. The sense amplifier is not overdriven upon the activation of the column line signal CLZ. This prevents the weak signal on the bit lines BL and /BL from being amplified under overdrive before the arrival of the write data, and therefore the data are inverted in a short time.

Then, due to the activation of the sense amplifier activating timing signal BLEPZ, the sense amplifier activating signal LEPX is activated, and the write data are amplified (overdriven) (FIG. 24(c)). Here, the sense amplifier activating timing signal BLEPZ is activated later, compared to that of the prior art (the chain line in the chart), by the delay circuit 74d in the CL activating timing generator 68 shown in FIG. 23. Therefore, the sense amplifier activating signal LEPX is activated later compared to that of the prior art (the chain line in the chart).

Then, the inactivation of the sense amplifier activating timing signal BLEPZ inactivates the sense amplifier activating signal LEPZ to terminate the overdrive (FIG. 24(d)). At the same time, the sense amplifier activating signal LEX is activated so that the higher voltage falls to the power supply voltage VII.

The result is that even though the overdriving period is started later compared to the prior art, the write operation of data in the memory cell is faster by the time T3 compared to the prior art.

Subsequently, the inactivation of the sense amplifier activating timing signal BLEZ inactivates the sense amplifier activating signals LEX and LEZ to terminate the amplifying operation of the sense amplifier.

The semiconductor integrated circuit of this embodiment can also offer the same effect as that obtained from the third embodiment described previously. Moreover, in this embodiment, the activation of the column switches 4i and 4j in a write operation is made earlier than in a read operation. This allows the minimization of the period for amplifying the weak signal irrelevant to write data. As a result, the data across the bit lines BL and /BL can be inverted in a short time, thereby reducing the time required for the write operation.

Furthermore, the column switches 4i and 4j are turned ON to supply the write data to the bit lines BL and /BL before the overdriving period of the sense amplifier. This can prevent the weak signal irrelevant to write data from being amplified under overdrive in a write operation. Accordingly, the time required for a write operation can be reduced without increasing the time necessary for a read operation.

In the above-described embodiments, the present invention is applied to an FCRAM. However, the present invention is not limited to such embodiments. For example, the present invention may be applied to a system LSI having the memory core and peripheral circuits of DDR-FCRAMs or FCRAMs on board.

Moreover, in the above-described embodiments, the logic synthesis part 54 consists of a NOR gate so as to perform an AND operation of negative logic. However, the present invention is not limited to such embodiments. For example, the logic synthesis part may consist of a NAND gate to perform an OR operation of negative logic. In this case, to the each input of the logic synthesis part are respectively supplied a signal that turns to low level in synchronization with the accepting signal in a write operation and a signal that turns to low level at the beginning of a read operation.

The invention is not limited to the above embodiments and various modifications may be made without departing from the spirit and the scope of the invention. Any improvement may be made in part or all of the components.

What is claimed is:

1. A semiconductor integrated circuit comprising:
   a memory core unit, including
      a memory cell,
      a bit line connected to said memory cell,
      a resetting circuit for resetting said bit line to a predetermined voltage,
      a sense amplifier for amplifying data transmitted to said bit line, and
      a column switch for transmitting data to said bit line; and
   a controlling signal generating unit for activating a bit line controlling signal for inactivating said resetting circuit, before said memory core unit receives write data, and for activating a word line signal for controlling the connection between said memory cell and said bit line, a sense amplifier activating signal for activating said sense amplifier, and a column line signal for activating said column switch, after said memory core unit receives write data.

2. The semiconductor integrated circuit according to claim 1, comprising a serial/parallel conversion circuit for accepting serial data to be written in said memory cell and converting the serial data into parallel data, wherein
   said controlling signal generating unit activates said word line signal, said sense amplifier activating signal, and said column line signal in synchronization with an accepting signal used for said serial/parallel conversion circuit.

3. The semiconductor integrated circuit according to claim 2, wherein said controlling signal generating unit comprises:
   a first controlling circuit for generating a first activating signal activated in synchronization with said accepting signal in the write operation and kept activated throughout a read operation;
   a second controlling circuit for generating a second activating signal activated in synchronization with both the start of the write operation and the start of the read operation; and
   a detecting circuit for detecting the activation of both said first activating signal and said second activating signal, and wherein said work line signal, said sense amplifier activating signal, and said column line signal are generated by using the detection result of said detecting circuit.

4. The semiconductor integrated circuit according to claim 2, wherein said controlling signal generating unit comprises:
   a first controlling circuit for generating a first activating signal activated in synchronization with said accepting signal in the write operation;
   a second controlling circuit for generating a second activating signal activated in synchronization with the start of a read operation; and
   a detecting circuit for detecting the activation of either said first activating signal or said second activating signal, and wherein said work line signal, said sense amplifier activating signal, and said column line signal are generated by using the detection result of said detecting circuit.

5. The semiconductor integrated circuit according to claim 1, wherein said controlling signal generating unit activates said column line signal in the write operation earlier than it would in the read operation.

6. The semiconductor integrated circuit according to claim 5, wherein said sense amplifier has an overdriving function of using a higher voltage during a predetermined period at the start of amplification and
   said controlling signal generating unit, in said write operation, activates said column line signal before the overdriving.

7. A semiconductor integrated circuit comprising:
   a memory core unit, including
      a memory cell,
      a bit line connected to said memory cell,
      a resetting circuit for resetting said bit line to a predetermined voltage,
      a sense amplifier for amplifying data transmitted to said bit line, and
      a column switch for transmitting data to said bit line; and
   a controlling signal generating unit for activating a bit line controlling signal for inactivating said resetting circuit and a word line signal for controlling the connection between said memory cell and said bit line before said memory core unit receives write data, and for activating a sense amplifier activating signal for activating said sense amplifier and a column line signal for activating said column switch, after said memory core unit receives write data.

8. The semiconductor integrated circuit according to claim 7, comprising a serial/parallel conversion circuit for accepting serial data to be written in said memory cell and converting the serial data into parallel data, wherein
   said controlling signal generating unit activates said sense amplifier activating signal and said column line signal in synchronization with an accepting signal used for said serial/parallel conversion circuit.

9. The semiconductor integrated circuit according to claim 8, wherein said controlling signal generating unit comprises:
   a first controlling circuit for generating a first activating signal activated in synchronization with said accepting signal in the write operation and kept activated throughout a read operation;
   a second controlling circuit for generating a second activating signal activated in synchronization with both the start of the write operation and the start of the read operation; and
   a detecting circuit for detecting the activation of both said first activating signal and said second activating signal, and wherein
   said sense amplifier activating signal and said column line signal are generated by using the detection result of said detecting circuit.

10. The semiconductor integrated circuit according to claim 8, wherein said controlling signal generating unit comprises:
    a first controlling circuit for generating a first activating signal activated in synchronization with said accepting signal in a write operation;
    a second controlling circuit for generating a second activating signal activated in synchronization with the start of a read operation; and
    a detecting circuit for detecting the activation of either said first activating signal or said second activating signal, and wherein
    said sense amplifier activating signal and said column line signal are generated by using the detection result of said detecting circuit.

11. The semiconductor integrated circuit according to claim 7, wherein said controlling signal generating unit activates said column line signal in the write operation earlier than it would in the read operation.

12. The semiconductor integrated circuit according to claim 11, wherein said sense amplifier has an overdriving function of using a higher voltage during a predetermined period at the start of amplification and said controlling signal generating unit, in said write operation, activates said column line signal before the overdriving.

13. Semiconductor integrated circuit comprising:

a memory cell;

a bit line coupled to said memory cell;

a sense amplifier for amplifying data on said bit line by coupling said bit line with a first power supply voltage or a second power supply voltage higher than the first power supply voltage;

a data bus line;

a column switch disposed between said bit line and said data bus line; and a controlling signal generating unit for activating, in a write operation mode, a column line signal for turning on said column switch before an overdrive signal which controls the coupling of said bit line with said second power supply voltage, is activated.

14. A semiconductor memory device, comprising:

a memory core unit including a word line, a bit line, a memory cell, selected by said word line, for storing data from said bit line, and a column switch coupled between said bit line and a data bus;

a parallel data circuit for supplying parallel data to said memory core unit in response to a first timing signal;

a word line activating timing generator for selecting said word line;

a sense amplifier activating timing generator for activating said sense amplifier; and a column switch activating timing generator for turning said column switch on, wherein one of said word line activating timing generator, said sense amplifier activating timing generator, and said column switch activating timing generator starts operating before said first timing signal is activated.

15. A semiconductor memory device, comprising:

a memory core unit including a word line, a bit line, a memory cell, selected by said word line, for storing data from said bit line, a sense amplifier for amplifying data on said bit line; and a column switch coupled between said bit line and a data bus;

a core timing controlling unit including a bit line activating timing generator for resetting said bit line a word line activating timing generator for selecting said word line; and a sense amplifier activating timing generator for activating said sense amplifier; and a basic signal generator for generating a basic signal to control said core timing controlling unit; wherein one of said bit line activating timing generator, said word line activating timing generator, and said sense amplifier activating timing generator starts operating in response to said basic signal.

* * * * *